United States Patent [19]
Itoi

[11] Patent Number: 6,154,867
[45] Date of Patent: *Nov. 28, 2000

[54] DATA-REPRODUCING DEVICE

[75] Inventor: Satoshi Itoi, Tokyo, Japan

[73] Assignee: NEC Corporation, Tokyo, Japan

[ * ] Notice: This patent is subject to a terminal disclaimer.

[21] Appl. No.: 09/034,330

[22] Filed: Mar. 4, 1998

[30] Foreign Application Priority Data

Mar. 5, 1997 [JP] Japan .................................. 9-049511

[51] Int. Cl.$^7$ ................................................... G11C 29/00

[52] U.S. Cl. ........................... 714/769; 714/795; 714/796

[58] Field of Search .................................... 714/786, 792, 714/794, 795, 796, 797, 769; 375/229, 263, 290, 341; 369/59

[56] References Cited

U.S. PATENT DOCUMENTS

| | | | |
|---|---|---|---|
| 5,327,441 | 7/1994 | Kawazoe et al. | 714/795 |
| 5,398,254 | 3/1995 | Miya et al. | 714/795 |
| 5,469,452 | 11/1995 | Zehavi | 714/792 |
| 5,689,532 | 11/1997 | Fitzpatrick | 375/341 |
| 5,809,071 | 9/1998 | Kobayashi et al. | 375/229 |
| 5,983,383 | 11/1999 | Wolf | 714/755 |

FOREIGN PATENT DOCUMENTS 4-298865  10/1992  Japan .
6-267203   9/1994  Japan .

*Primary Examiner*—Emmanuel L. Moise
*Attorney, Agent, or Firm*—McGuire Woods, LLP

[57] ABSTRACT

A data-reproducing device includes: a subtraction absolute value circuit for calculating a substraction absolute value from pre-equalized reproduce data and estimate data output from RAM, outputting the subtraction absolute value as branchmetrics; a comparison and selection circuit for comparing addition values of the branchmetrics and previously calculated pathmetrics are added, selecting a smaller one of the values as the result of comparison, outputting the smaller one of the values as new pathmetric as well as a selection signal as to which of the values is selected; a path memory circuit for storing the selection signal, obtaining the most probable path by unifying paths, outputting the most probable data according to the most probable path; a RAM circuit for outputting estimate data judged to be closest to the pre-equalized reproduce data by using a present output of the path memory circuit as an address; and a data correction circuit for renewing an internal data of the RAM circuit based upon a data obtained by using, as an address, the pre-equalized reproduce data delayed by a predetermined value and continuous data output from the path memory circuit.

83 Claims, 22 Drawing Sheets

| DATA | ADDRESS | DATA | ADDRESS |
|---|---|---|---|
| RM(0) | 00   000<br>10<br>21 | RM(8) | 22   100<br>32 |
| RM(1) | 00   001<br>10<br>21 | RM(9) | 22   101<br>32 |
| RM(2) | 00   012<br>10<br>21 | RM(10) | 22   112<br>32 |
| RM(3) | 00   122<br>10<br>21 | RM(11) | 12   210<br>23<br>33 |
| RM(4) | 00   123<br>10<br>21 | RM(12) | 12   211<br>23<br>33 |
| RM(5) | 01   221<br>11 | RM(13) | 12   321<br>23<br>33 |
| RM(6) | 01   232<br>11 | RM(14) | 12   332<br>23<br>33 |
| RM(7) | 01   233<br>11 | RM(15) | 12   333<br>23<br>33 |

FIG.15

DATA-REPRODUCING DEVICE

FIELD OF THE INVENTION

This invention relates to a data-reproducing device used in a digital recording device or digital transmission device where digital data, digital image and voice, and system data are recorded in or transmitted to a medium, such as optical disk including opto-magnetic disk and phase-change disk, magnetic disk and magnetic tape.

BACKGROUND OF THE INVENTION

Conventionally, in a digital recording disk device, digital recording VTR etc., data are recorded after converting into a recording code, without recording the data as they are. Therein, 1,7 code and 2,7 code are typical recording codes.

In 1,7 code, after a 2-bit data bit is converted into a 3-bit channel bit or after a 4-bit data bit is converted into a 6-bit channel bit, it is recorded by using NRZI rule. The NRZI rule is a recording rule that inversion is conducted by "1" and non-inversion is conducted by "0". A big characteristic of 1,7 code is that there exists 1 or more and 7 or less of "0" between "1" and "1" after converting, i.e., the minimum inversion interval is 2.

In 2,7 code, after a 2-bit data bit is converted into a 4-bit channel bit or after a 3-bit data bit is converted into a 6-bit channel bit, it is recorded by using the NRZI rule. A big characteristic of 2,7 code is that there exists 2 or more and 7 or less of "0" between "1" and "1" after converting, i.e., the minimum inversion interval is 3.

A method has been suggested where, to record and reproduce signals, the data detection is conducted by combining partial response equalization and Viterbi decoding. For example, this method is disclosed in Japanese patent application laid-open No. 4-298865 (1992) (application No. 3-64201 (1991)) titled "Method of Detecting Reproduce Data" filed by the present applicant.

In the reproduce data detection method described in No. 4-298865, a code with a minimum inversion interval of 2, such as 1,7 code is recorded. In reproducing, a bit error correction process is conducted by converting a reproduce signal into a ternary data by PR(1,1) equalization and then decoding it by four-state Viterbi decoding to reduce an error rate.

However, in the conventional reproduce data detection method that uses the combination of a partial response equalization system and Viterbi decoding, there is a problem that it cannot conduct a reproduction-adaptive operation, whereas it can perform a bit error correction to reduce the error rate. Namely, PR(1,1) equalization always conducts fixed equalization even when a change in reproduce signal due to a variation in record current when recording, a variation in medium characteristics caused by a record position, a variation in record and reproduce characteristics caused by temperature or the like occurs. Therefore, the equalization characteristic cannot follow the change in reproduce signal.

SUMMARY OF THE INVENTION

Accordingly, it is an object of the invention to provide a data-reproducing device that the error rate can be reduced by conducting bit error correction even when the pre-equalization characteristic is varied.

According to the invention, a data-reproducing device, comprises:

- a subtraction absolute value circuit for calculating a subtraction absolute value from pre-equalized reproduce data and estimate data output from RAM, outputting the subtraction absolute value as branchmetric;
- a comparison and selection circuit for comparing values that the branchmetric and previously calculated pathmetric are added, selecting a smaller one of the value as the result of comparison, outputting the smaller one of the values as new pathmetric as well as a selection signal as to which of the values is selected.
- a path memory circuit for storing the selecting signal, obtaining the most probable path by unifying paths, outputting the most probable data according to the most probable path;
- a RAM circuit for outputting estimate data judged to be closest to the pre-equalized reproduce data by using a present output of the path memory circuit as an address; and
- a data correction circuit for renewing an internal data of the RAM circuit based upon a data obtained by using, as an address, the pre-equalized reproduce data delayed by a predetermined value and continuous data output from the path memory circuit.

BRIEF DESCRIPTION OF THE DRAWINGS

The invention will be explained in more detail in conjunction with the appended drawings, wherein:

FIG. 15 is a table showing a list of RAM address.

DESCRIPTION OF THE PREFERRED EMBODIMENTS

A data-reproducing device in the first preferred embodiment, which is a typical example for the explanation claim 17 will be explained in FIGS. 1 and 7 to 15.

Figure 1:
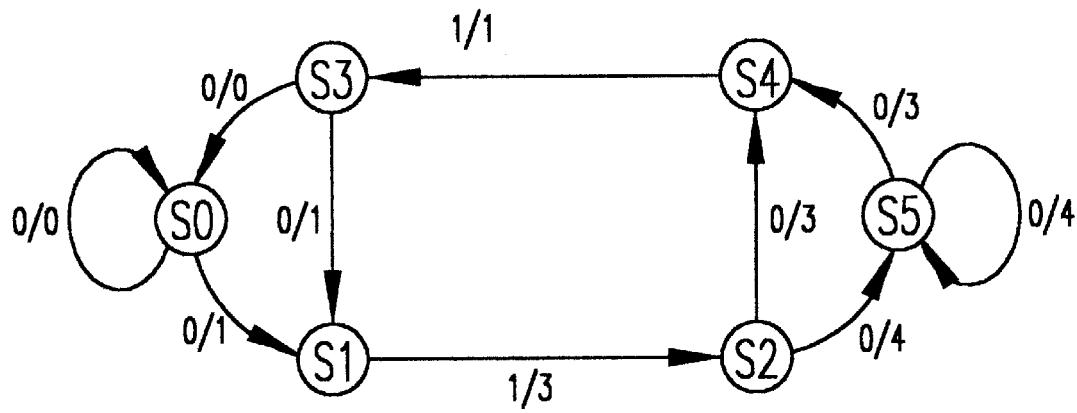
FIG. 1 is an illustration showing a state change to each block under the conditions of a minimum inversion interval of 2 and PR(1,2,1) pre-equalization.

FIG. 1 shows a state change where reproduce data in which a recording code with a minimum inversion interval of 2 is recorded are pre-equalized into quarternary value(0, 1,3,4) by PR(1,2,1) pre-equalization. Here, the priority of equalization such as PR(1,1), PR(1,2,1) and PR(1,2,2,1) is changed depending on optical disk characteristic. Namely, PR(1,2,1) is used when the optical disk characteristic has a priority as to PR(1,2,1)).

Figure 2:
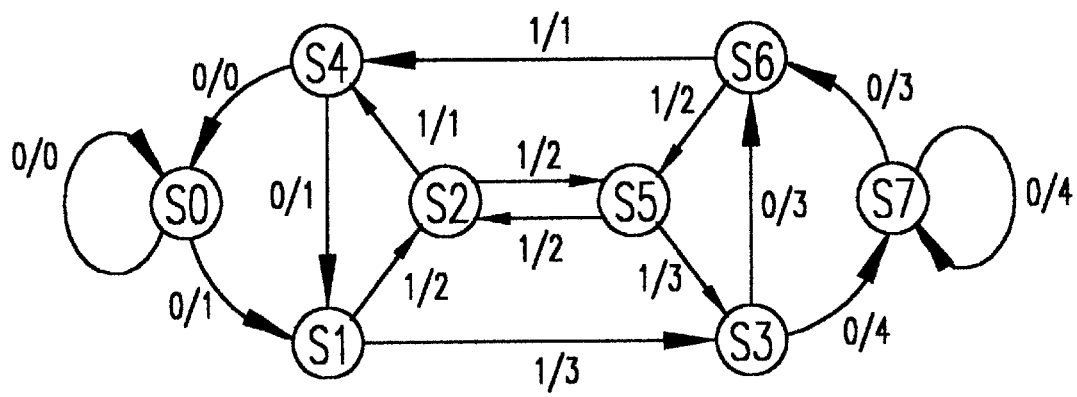
FIG. 2 is an illustration showing a state change to each block under no condition of minimum inversion interval and PR(1,2,1) pre-equalization.
Figure 3:
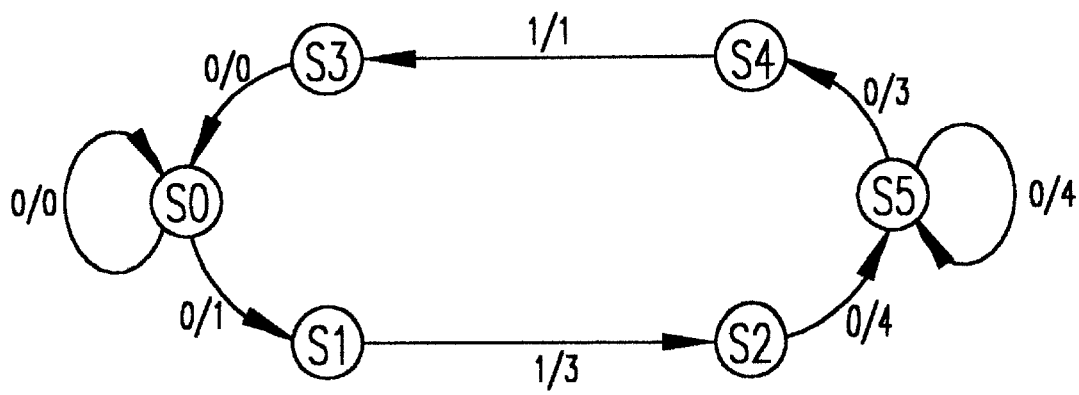
FIG. 3 is an illustration showing a state change to each block under the conditions of a minimum inversion interval of 3 and PR(1,2,1) pre-equalization.

Of numerals on the arrow lines from one state to another state in FIGS. 1 to 3, the denominator represents a seven-element level and the numerator represents a binary output.

Figure 7:
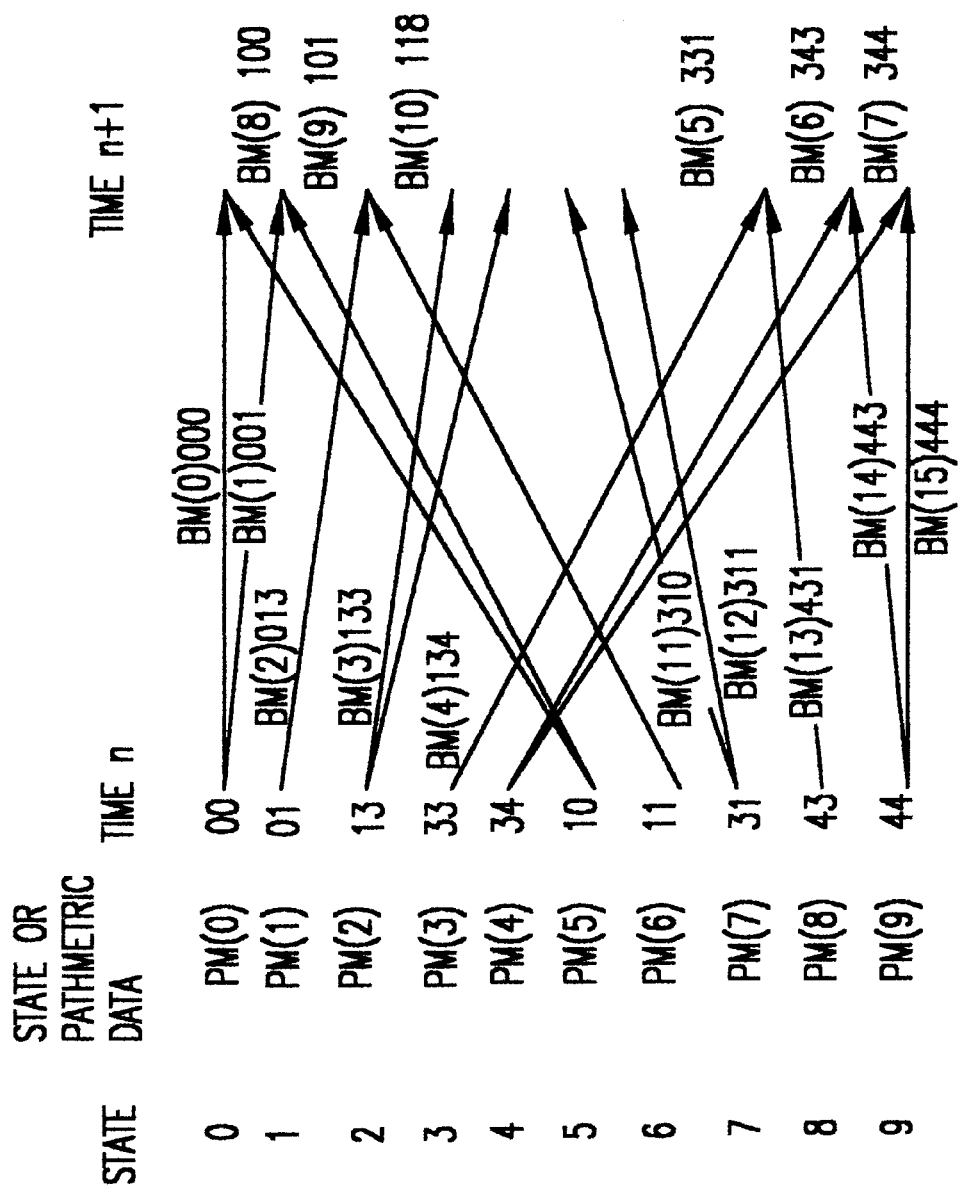
FIG. 7 is an illustration showing a state change (corresponding to claim 9) to each block under the conditions of 3-clock path data, a minimum inversion interval of 2 and PR(1,2,1) pre-equalization, where the lateral axis indicates time.

Next, FIG. 7 shows a state change where the lateral axis indicates time. In FIG. 7, an arrow is called 'path' and a position targeted by an arrow is called 'state'. As 4-clock data are considered, the number of states are 10, which is different from 6 states in FIG. 1. 6 states will be explained later. Also, the negative logarithm of a probability is called 'metric'.

When PR(1,2,1) equalization is applied to a code with a minimum inversion interval of 2, there are characteristics that a quarternary(0,1,3,4) output is obtained and "03", "04", "14", "30", "40" and "41" do not appear. Thus, using these characteristics, 3-clock continuous data that are paths reaching time n, consist of 16 patterns of 000, 001, 033, 100, 101, 113, 133, 134, 310 311, 331, 343, 344, 431, 443 and 444. The negative logarithms of probabilities that inputs correspond to the above respective continuous data are called 'branchmetric', and are represented by BM(0) to BM(15) in that order. Also, 3-clock continuous data that are paths reaching time N+1, consist of 16 patterns of 000, 001, 013, 100, 101, 113, 133, 134, 310, 311, 331, 343, 344, 431, 443 and 444. Here, between the 3-clock continuous data to reach time n and the 3-clock continuous data to reach time n+1, 2-clock parts are common and are of 10 patterns of 00, 01, 13, 33, 34, 10, 11, 31, 43 and 44. The negative logarithms of probabilities to reach these 10 states are called 'pathmetric' at time n and are represented by PM(0) to PM(9) in that order. FIG. 7 indicates that these relations are transferred like the following Table 1.

TABLE 1 time n
BM(0)000 →PM(0)00 →BM(0)000, or BM(1)001
BM(1)001 →PM(1)01 →BM(2)013
BM(2)113 →PM(2)13 →BM(3)133, or BM(4)134
BM(3)133 →PM(3)33 →BM(5)331
BM(4)134 →PM(4)34 →BM(6)343, or BM(7)344
BM(5)331 →PM(7)31 →BM(11)310, or BM(12)311
BM(6)343 →PM(8)43 →BM(13)431
BM(7)344 →PM(9)44 →BM(14)443, or BM(15)444
BM(8)100 →PM(0)00 →BM(0)000, or BM(1)001
BM(9)101 →PM(1)01 →BM(2)013
BM(10)113 →PM(2)13 →BM(3)133, or BM(4)134
BM(11)310 →PM(5)10 →BM(8)100, or BM(9)101
BM(12)311 →PM(6)11 →BM(10)113
BM(13)431 →PM(7)31 →BM(11)310, or BM(12)311
BM(14)443 →PM(8)43 →BM(13)431
BM(15)444 →PM(9)44 →BM(14)443, or BM(15)444

In Table 1, for example, the first row shows that branch-metric BM(0) is a metric of "000", pathmetric PM(0) at time n is a metric of "00" that "0" at the left and corresponding to the oldest past of BM(0) is deleted, thereafter, at time n+1, it changes into "000" for BM(0) or "001" for BM(1) by adding "0" or "1" at the right end since "0" or "1" follows "00".

Also, the second row shows that branchmetric BM(1) is a metric of "001", pathmetric PM(1) at time n is a metric of "01" that "0" at the left end corresponding to the oldest past of BM(1) is deleted, thereafter, at time n+1, it changes into "013" for BM(2) by adding "3" at the right end since only "3" follows "01".

Like meanings are also provided in the third to sixteenth rows.

Then, in FIG. 7, pathmetric at each state is selected as smaller one of the addition values of pathmetric at one clock before and branchmetric(s) from this pathmetric at one clock before to the pathmetric concerned. Namely, it is selected according to equation (1):

$$PM(0)=\min[PM(0)+BM(0), PM(5)+BM(8)]$$

$$PM(1)=\min[PM(0)+BM(1), PM(5)+BM(9)]$$

$$PM(2)=\min[PM(1)+BM(2), PM(6)+BM(10)]$$

$$PM(3)=PM(2)+BM(3)$$

$$PM(4)=PM(2)+BM(4)$$

$$PM(5)=PM(7)+BM(11)$$

$$PM(6)=PM(7)+BM(12)$$

$$PM(7)=\min[PM(3)+BM(5), PM(8)+BM(13)]$$

$$PM(8)=\min[PM(4)+BM(6), PM(9)+BM(14)]$$

$$PM(9)=\min[PM(4)+BM(7), PM(9)+BM(15)] \quad (1)$$

where a right-hand pathmetric has a value one clock older than a left-hand pathmetric.

Figure 8:
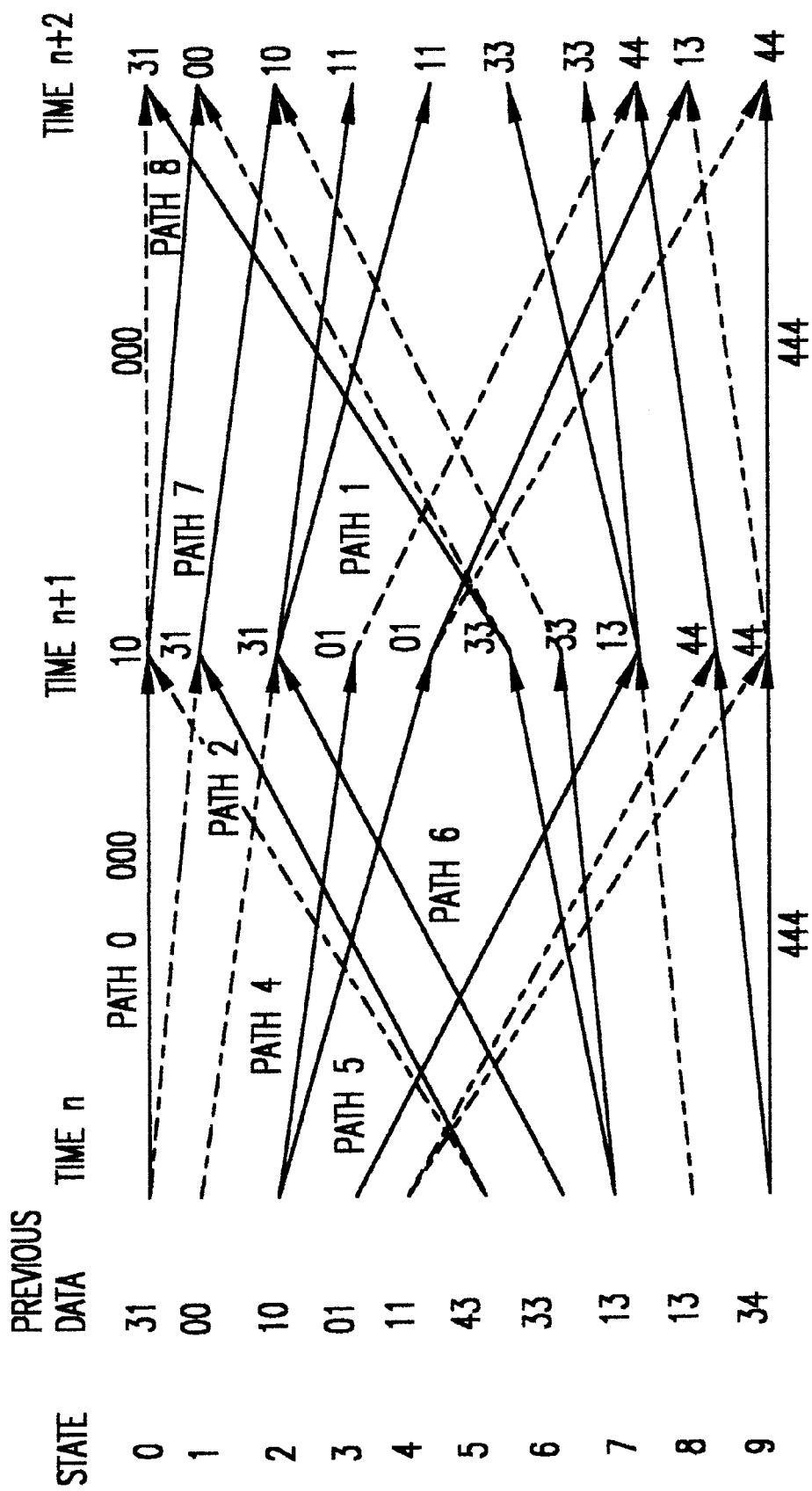
FIG. 8 is an illustration showing a state change extending by one clock from that in FIG. 1 while selecting paths.

Calculating thus pathmetric, paths are selected and survival paths are continued in the form of an arrow, and 5-clock estimate data at the respective paths are obtained. FIG. 8 shows 2-clock path selection, where full lines represent selected and survived paths and dotted lines represent unselected paths.

Of 5-clock estimate data, the top 2 clocks are called "previous data" and the last 3 clocks are called "path data". The previous data are 2-clock data at before reaching respective states. As understood from FIG. 8, to states 0, 1 and 2, one of "00", "10" and "31" is selected, to states 3 and 4, one of "01" and "11" is selected, to states 5 and 6, one of "33" and "43" is selected, and, to states 7, 8 and 9, one of "13", "34" and "44" is selected. Also, the path data are 3-clock data following the respective states, which are defined as 3-clock continuous data in the calculation of branchmetric described earlier. Of data described in FIG. 8, "000" and "444" are typical examples of 3-clock path data, and the other data are all 2-clock previous data.

In state 0, time n is reached from previous data "31". Time n+1 is reached from previous data "31" and followed by path data "000", therefore summing into "31000", which is 5-clock estimate data corresponding to survival path 0. Time n+2 is reached from 1" and $2^{nd}$ clocks "33"of "3310" shifted by one clock to the left of "13310" that is summed from "13" at time n/states 7 and "310" reaching time n+1/state 5 from there, thereafter followed by "100", therefore summing into "33100", which is 5-clock estimate data corresponding to survival path 1.

In state 1, time n is reached from previous data "00", but not continuing anywhere thereafter. Time n+1 is reached from previous data "43" at time n/state 5, thereafter followed by path data "101", therefore summing into "43101", which is 5-clock estimate data corresponding to survival path 2. Time n+2 is reached from $1^{st}$ and $2^{nd}$ clocks "10" of "1000" shifted by one clock to the left of "31000" that is summed from "31" at time n/state 0 and "000" reaching time n+1/state 0 from there, thereafter followed by "001", therefore summing into "10001", which is 5-clock estimate data corresponding to survival path 3.

In state 2, time n is reached from previous data "10", thereafter followed by "133", "134", therefore summing into "10133", "10134", which are 5-clock estimate data corresponding to survival paths 4, 5. Time n+1 is reached from previous data "33" at time n/state 6 and followed by path data "113", therefore summing into "33113", which is 5-clock estimate data corresponding to survival path 6. Time n+2 is reached from $1^{st}$ and $2^{nd}$ clocks "31" of "3101" shifted by one clock to the left of "43101" that is summed from "43" at time n/state 5 and "101" reaching time n+1/state 1 from there, thereafter followed by "013", therefore summing into "31013", which is 5-clock estimate data corresponding to survival path 7.

Also, in states 3 to 9, 5-clock estimate data are obtained in like manner.

Thus, branchmetric is obtained by calculating the absolute value of a difference between the input estimate signal to 5-clock estimate data and the pre-equalized actual input data.

Figure 9:
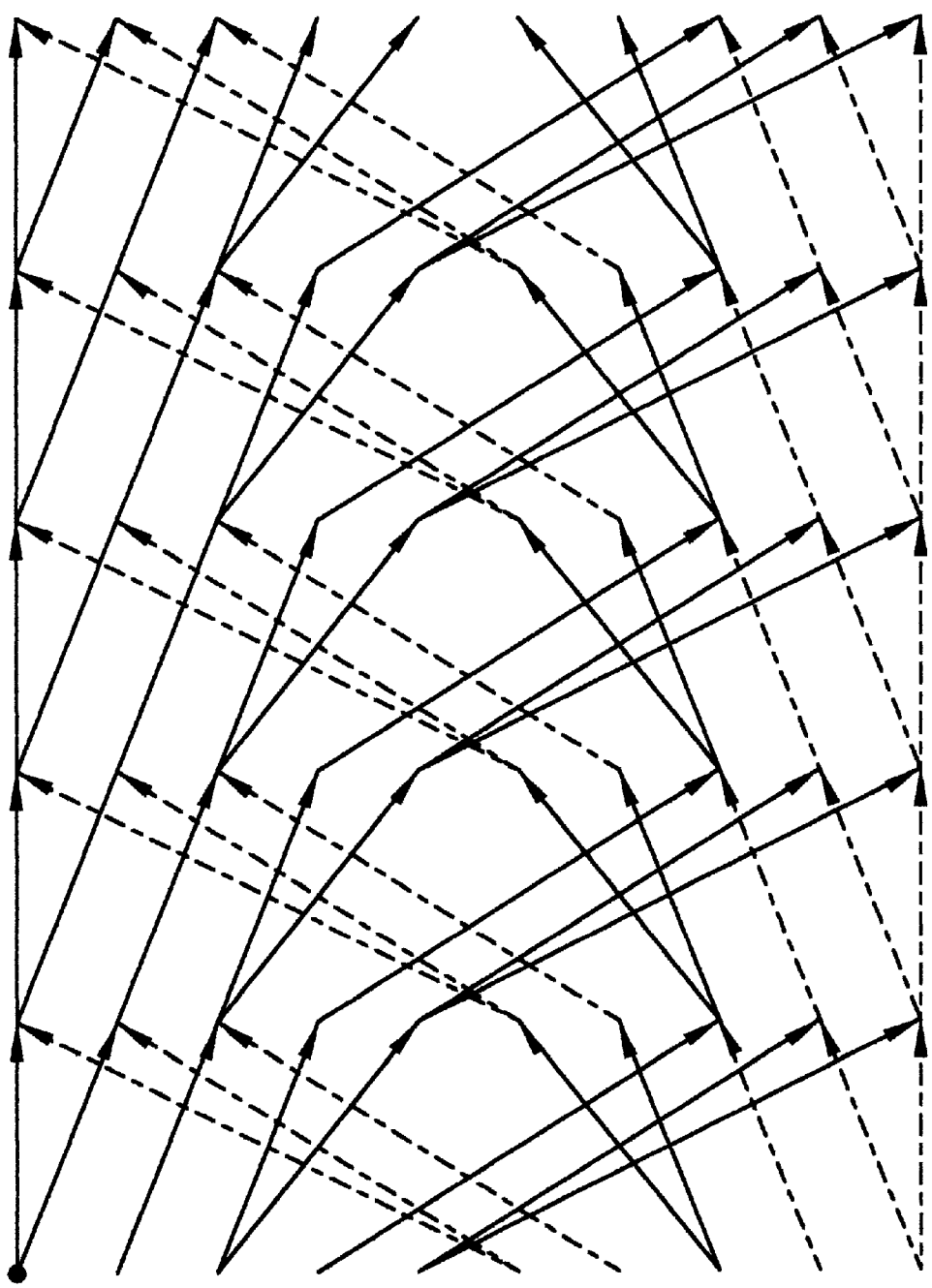
FIG. 9 is an illustration showing a state change extending further by several clocks from that in FIG. 8 while unifying paths.

FIG. 9 shows a state change that paths are extended by further several clocks from those in FIG. 8. When the path selection is conducted as shown in FIG. 9, the paths can be unified to the past state. In FIG. 9, the paths are unified to mark "●" at state 0.

Referring to FIG. 7, quaternary levels corresponding to the respective states can be known. It is the first clock of state or pathmetric. Namely, when paths are unified to state 0, 1, the quaternary level is "0". when paths are unified to state 2, 5, 6, the quaternary level is "1". When paths are unified to state 3, 4, 7, the quaternary level is "3". When paths are unified to state 8, 9, the quaternary level is "4". In like manner, these are also applicable to FIGS. 16 to 22 explained later.

Also, from numerator data in FIG. 1, binary outputs corresponding to the respective states can be known. Namely, the binary output is "1" when paths are unified to state 3, 4, 5, 6 that is reached at the next clock of BM(2) "013", BM(5) "331", BM(10) "113", BM(13) "431" which are path data, branchmetrics in FIG. 7, and the binary output is "0" when unified to the other state 0, 1, 2, 7, 8, 9. The obtained binary output ". . . 0010010100001001 . . . " shows NRZ data before decoding a recording code. In like manner, these are also applicable to FIGS. 2, 3 and 16 to 22 explained later.

Figure 10:
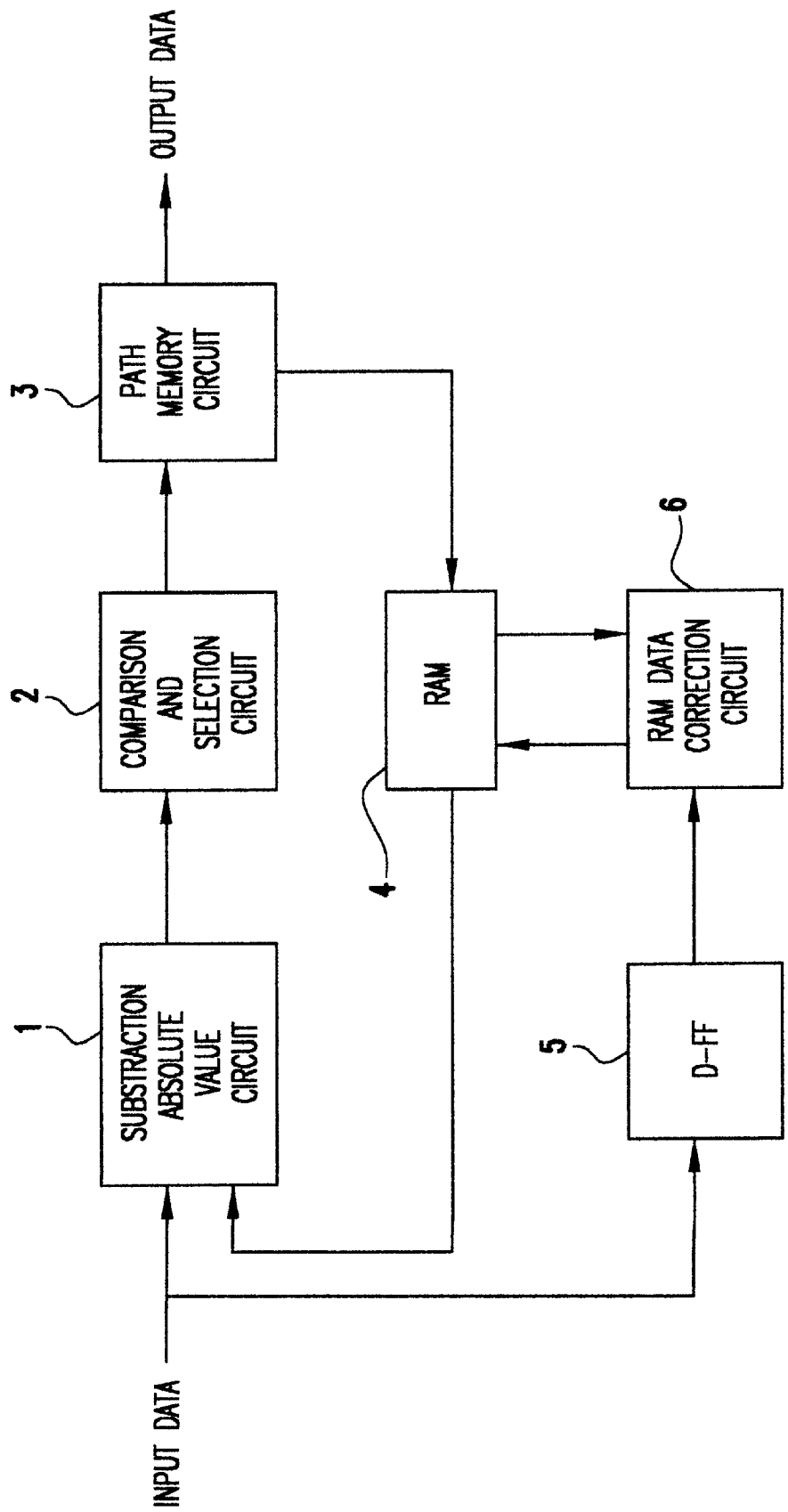
FIG. 10 is a block diagram showing a data-reproducing device in a preferred embodiment according to the invention.

Next, FIG. 10 shows a composition of the data-reproducing device in the embodiment.

Input data are pre-equalized into quaternary data by PR(1,2,1) equalization (not shown). Also, input from RAM 4 are 16 samples of the estimate data of input data that are estimated from 5-clock data composed of 3-clock path and 2-clock previous data, corresponding to the number of branchmetrics.

a subtraction absolute value circuit 1 calculates the absolute value of a difference, i.e., subtraction value, between the input data and the estimate data of the input data to obtain branchmetric. The output of the subtraction absolute value circuit 1 is 16 samples of the calculation result (branchmetrics) of substraction absolute value.

A comparison and selection circuit 2 compares addition values of previous-clock pathmetrics and branchmetrics, selecting the smaller one of them as the comparison result, simultaneously calculating pathmetric corresponding to a new clock. The comparison and selection circuit 2 outputs a comparison and selection signal to a path memory circuit 3 and pathmetric to a new clock the subtraction absolute value circuit 1.

The path memory circuit 3 stores several to tens of stages of 6-bit comparison and selection signals to be input from the comparison and selections circuit 2, inspecting the path unification by the signal values, generating RAM addresses for outputting the estimate data of input data stored in RAM 4 that are used in the comparison with the input data.

RAM 4 is a memory to store the estimate data of input data that are estimated from 5-clock data compound of 3-clock path and 2-clock previous data, and its initially-preset data are corrected by a RAM data correction circuit 6.

The RAM data correction circuit 6 calculates the more probable estimate data of input data from input data and the estimate data of input data that are estimated from 5-clock data composed of 3-clock path and 2-clock previous data, which are synchronized at a timing, then renewing the estimate data.

Figure 11:
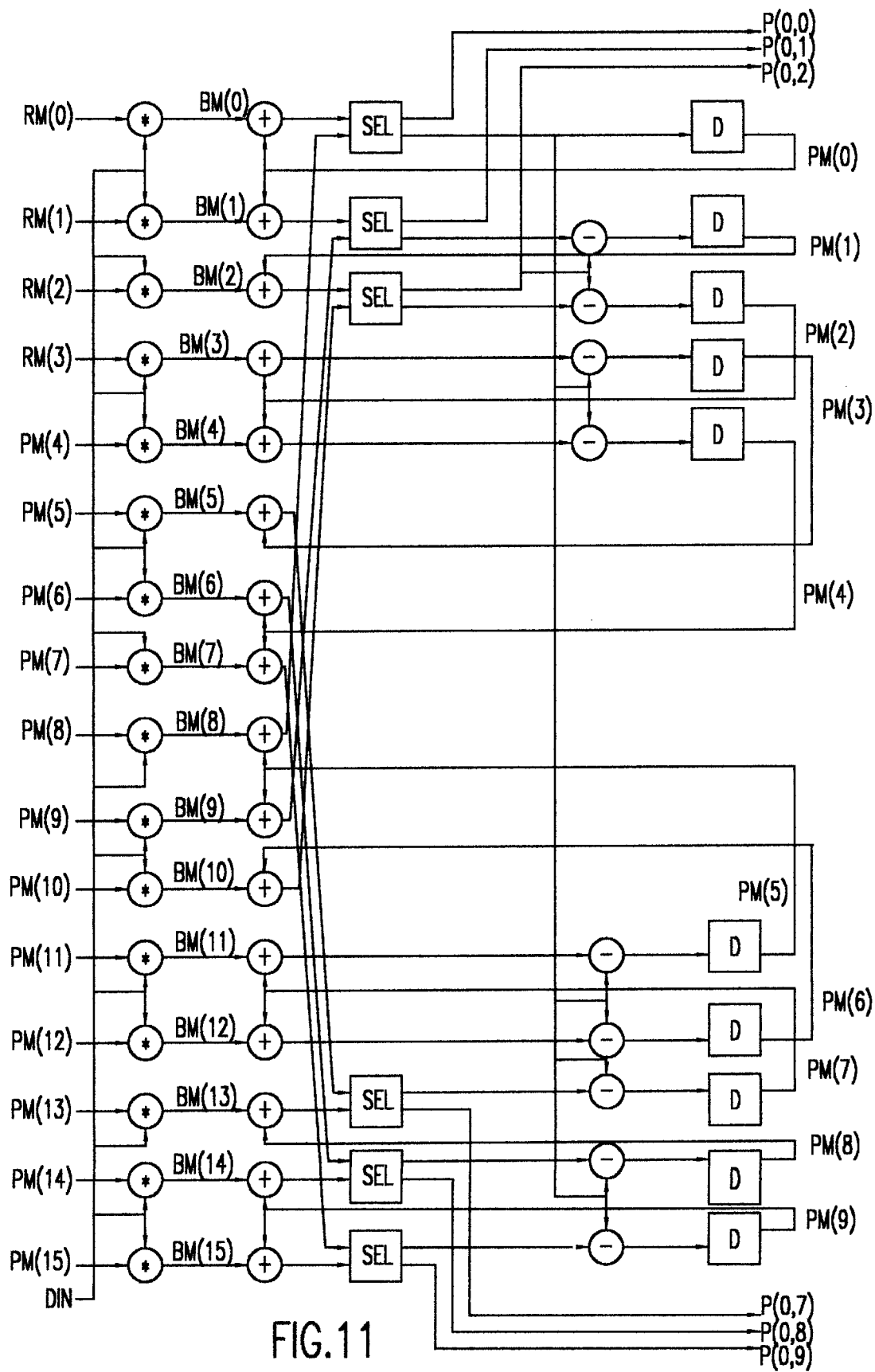
FIG. 11 is a block diagram showing a subtraction absolute value circuit and a comparison and selection circuit in the data-reproducing device in FIG. 10.

FIG. 11 shows examples of the subtraction absolute value circuit 1 and comparison and selection circuit 2.

In FIG. 11, Din is input data that are pre-equalized into quaternary data by PR(1,2,1) equalization, and RM(0) to RM(15) are the estimate data of input data that are estimated from 5-clock data composed of 3-clock path and 2-clock previous data, which are stored in RAM 4. Namely, addressing by 5-clock estimate data obtained by adding 2-clock previous data to 3-clock path data "000" to "444" the respective estimate data are read out as RM(0) to RM(15) from RAM 4. In the subtraction absolute value circuit, the respective absolute values are calculated by subtracting RM(0) to RM(15), respectively from Din to obtain branchmetrics BM(0) to BM(15). In FIG. 11, a mark "*" represents a circuit that a subtraction circuit and an absolute value calculating circuit are combined.

In the comparison and selection circuit, at first, from branchmetrics BM(0) to BM(15) and pathmetrics PM(0) to PM(15), its adder calculates:

PM(0)+BM(0), PM(0)+BM(1), PM(1)+BM(2)

PM(2)+BM(3), PM(2)+BM(4),

PM(3)+BM(5), PM(5)+BM(6), PM(4)+BM(7)

PM(5)+BM(8), PM(5)+BM(9), PM(6)+BM(10)

PM(7)+BM(11), PM(7)+BM(12)

PM(8)+BM(13), PM(9)+BM(14) and PM(9)+BM(15)     (2)

and then calculates:

PM(0)=min[PM(0)+BM(0), PM(5)+BM(8)]

PM(1)=min[PM(0)+BM(1), PM(5)+BM(9)]

PM(2)=min[PM(1)+BM(2), PM(6)+BM(10)]

PM(3)=PM(2)+BM(3)

PM(4)=PM(2)+BM(4)

PM(5)=PM(7)+BM(11)

PM(6)=PM(7)+BM(12)

PM(7)=min[PM(3)+BM(5), PM(8)+BM(13)]

PM(8)=min[PM(4)+BM(6), PM(9)+BM(14)]

PM(9)=min[PM(4)+BM(7), PM(9)+BM(15)]     (3)

Thus, as to PM(3) to PM(6), the addition results are adopted as they are. As to PM(0) to PM(2) and PM(7) to PM(9), the value comparison operation is conducted, where the smaller one is selected as new pathmetric, and then the 6-bit selection signals are output as survival path informations P(0,0), P(0,1), P(0,2), P(0,7), P(0,8) and P(0,9). Here, the first item in parenthesis represents time and the second item represents state number. In states 0 to 9, the survival path information is "0" when a path reaching from an upper state is selected, i.e., when the left item in parenthesis is selected in the minimum value selection as to PM(0) to PM(15) is selected, and the survival path information is "1" when a path reaching from a lower state is selected, i.e., when the right item in parenthesis is selected in the minimum value selection as to PM(0) to PM(15) is selected. Also, as the relative values of PM(0) to PM(15) are important, PM(0) is subtracted from all path memories so as to prevent the overflowing.

Figure 12:
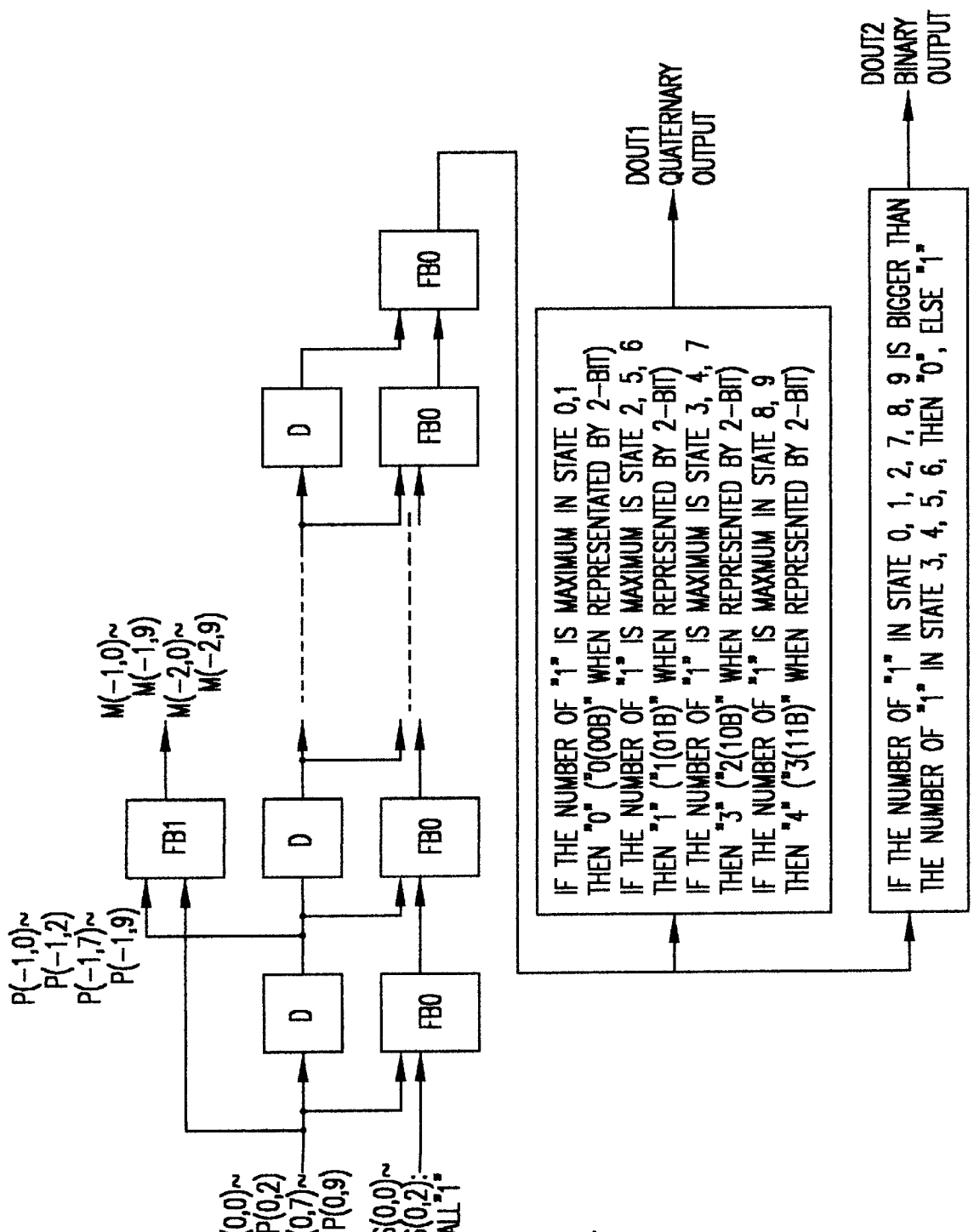
FIG. 12 is a block diagram showing a path memory circuit in the data-reproducing device in FIG. 10.

FIG. 12 shows an example of the path memory circuit 2.

As shown, the path memory circuit 2 comprises D-type flip-flops(D) and function blocks FB0, FB1. FB0 is a circuit for judging whether paths are unified at the pastest time from the present and tens of clocks of past selection signals. Also, FB1 is a circuit for calculating 2-bit previous data from survival path information P.

Figure 13:
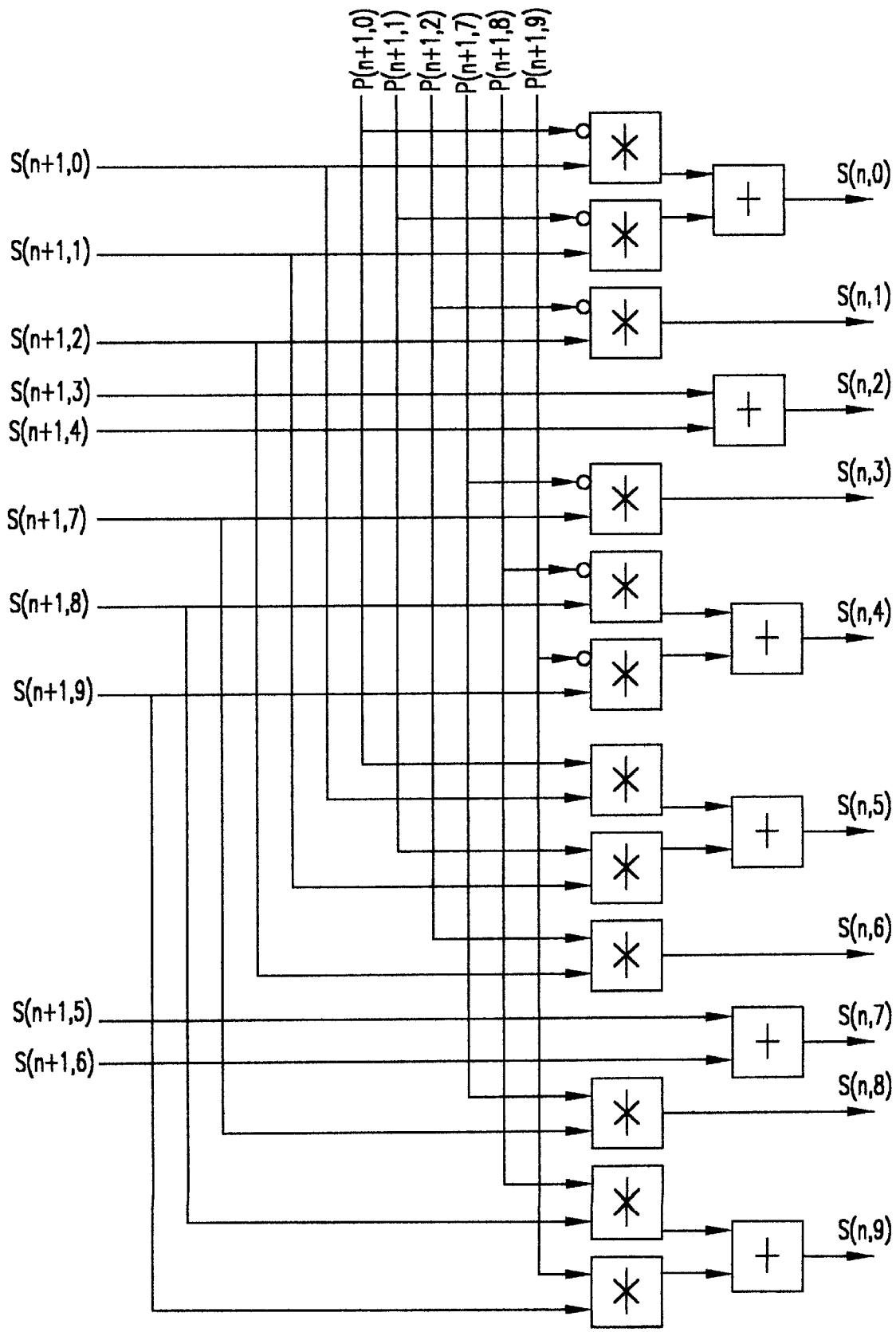
FIG. 13 is a block diagram showing a survival state information calculation circuit (FB0) in the path memory circuit in FIG. 12.

FIG. 13 shows an example of FB0.

10-bit survival state informations are represented by S(n+1,0) to S(n+1,9) and S(n,0) to S(n,9). Also, the above-mentioned 6-bit survival path informations are represented by P(n+1,0) to P(n+1,2) and P(n+1,7) to P(n+1,9).

In states 0 to 9, the survival state information is "1" when there is a possibility of reaching its state, and the survival state information is "0" when there is no possibility. Also, in states 0 to 9, the survival path information is "0" when a path reaching from an upper state is selected, i.e., when the left item in parenthesis is selected in the minimum value selection as to PM(0) to PM(15) is selected, and the survival path information is "1" when a path reaching from a lower state is selected, i.e., when the right item in parenthesis is selected in the minimum value selection as to PM(0) to PM(15) is selected.

At time n+2, there are possibilities of reaching all states 0 to 9. Therefore, S(n+2,0) to S(n+2,9) are all "1". Next, in states 0 to 2, paths to reach the respective states, i.e., arrows coming from lower, upper and upper states in the order are selected, and, in states 7 to 9, arrows coming from lower, upper and lower states in the order are selected. Therefore, P(n+2,0) to P(n+2,2) and P(n+2,7) to P(n+2,9) are represented by "100101".

At time n+1, viewing from time n+2, there are possibilities of reaching states 0, 1, 2, 4, 5, 7, 8 and 9, and there is no possibility of reaching states 3 and 6. Therefore, S(n+1,0) to S(n+1,9) are represented by "1110110111" in the order. Next, in states 0 to 2, paths to reach the respective states, i.e., arrows coming from upper, lower and lower states in the order are selected, and, in states 7 to 9, arrows coming from upper, lower and lower states in the order are selected. Therefore, P(n+1,0) to P(n+1,2) and P(n+1,7) to P(n+1,9) are represented by "011011".

At time n, viewing from times n+2, n+1, there are possibilities of reaching states 0, 2, 3, 5, 6, 7 and 9, and there is no possibility of reaching states 1, 4 and 8. Therefore, S(n,0) to S(n,9) are represented by "1011011101" in the order.

These relations are represented by:

$$S(n, 0) = [S(n+1, 0) \&\& \overline{P(n+1, 0)}] \| [S(n+1, 1) \&\& \overline{P(n+1, 1)}]$$

$$S(n, 1) = S(n+1, 2) \&\& \overline{P(n+1, 2)}$$

$S(n, 2) = S(n+1, 3) \| S(n+1, 4)$ $S(n, 3) = S(n+1, 7) \&\& \overline{P(n+1, 7)}$ $S(n, 4) = [S(n+1, 8) \&\& \overline{P(n+1, 8)}] \| [S(n+1, 9) \&\& \overline{P(n+1, 9)}]$ $S(n, 5) = [S(n+1, 0) \&\& P(n+1, 0)] \| [S(n+1, 1) \&\& P(n+1, 1)]$ $S(n, 6) = S(n+1, 2) \&\& P(n+1, 2)$ $S(n, 7) = S(n+1, 5) \| S(n+1, 6)$ $S(n, 8) = S(n+1, 7) \&\& P(n+1, 7)$ $S(n, 9) = [S(n+1, 8) \&\& P(n+1, 8)] \| [S(n+1, 9) \&\& P(n+1, 9)]$ Namely, FIG. 13 illustrates the above equations (4) as a block diagram.

Figure 14:
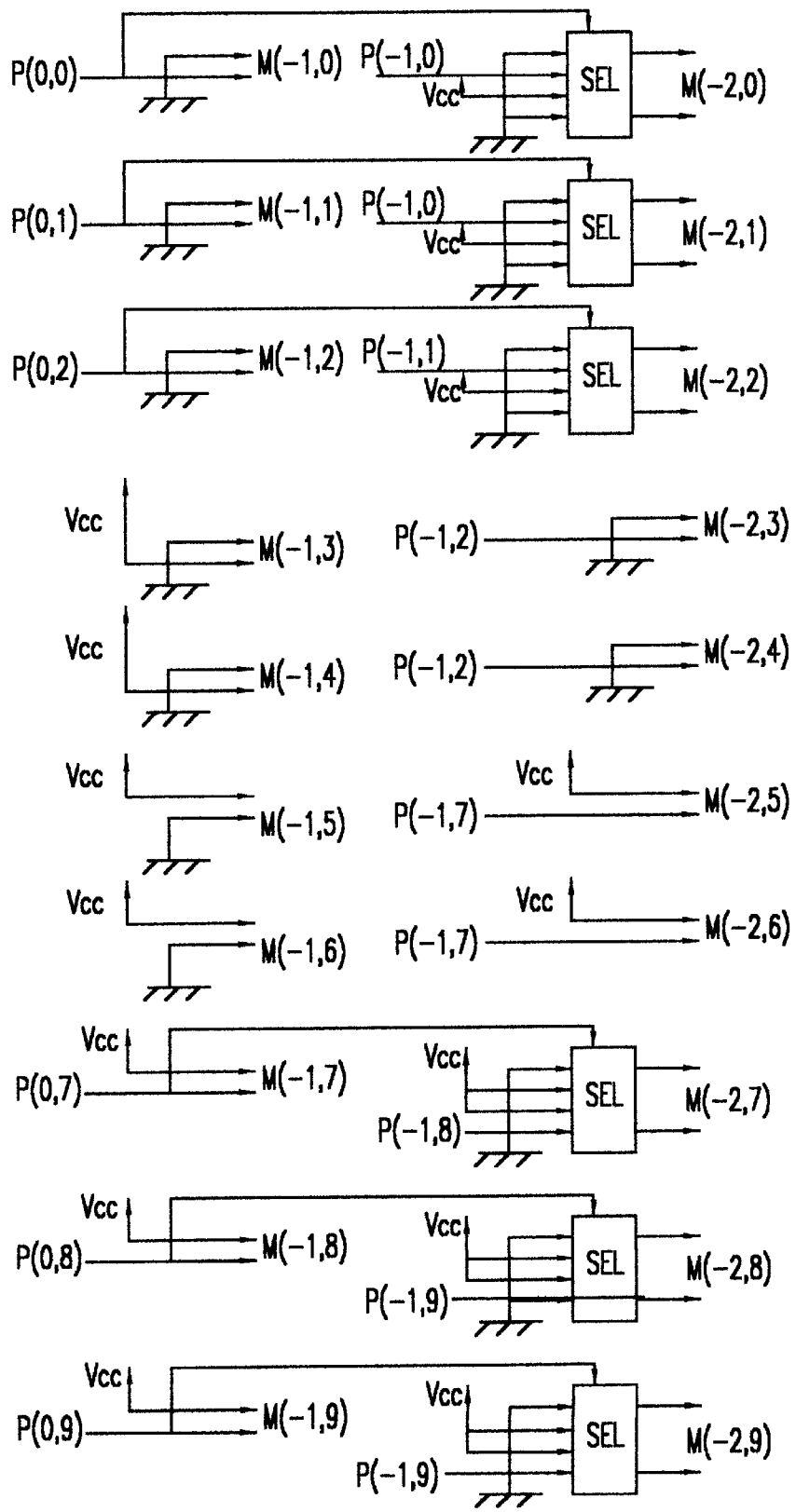
FIG. 14 is a block diagram showing a 2-clock previous data calculation circuit (FB1) in the path memory circuit in FIG. 12.

FIG. 14 shows an example of FB1. This is a circuit for calculating 2-clock previous data to 3-clock path data from the path memory result. In FIG. 14, there are shown circuit blocks that, to respective states 0 to 9 at time n, two-clock previous data at time n−1 and time n−2 are calculated as M(−1,0) to M(−1,9) and M(−2,0) to M(−2,9), respectively.

At the past time, when reaching states 0 and 1, the quarternary level is "0", when reaching states 2, 5 and 6, the quarternary level is "1", when reaching states 3, 4 and 7, the quarternary level is "3", and, when reaching states 8 and 9, the quarternary level is "4".

Meanwhile, in FIG. 14, in order to represent quaternary level (0,1,3,4) shown in FIGS. 1 and 7 by 2-bit, "0" and "1" are unalteredly represented by "0(00B)" and "0(01B)", respectively, and "3" and "4" are represented by "2(10B)" and "3(11B)", respectively. The explanation below will be made according to this To state 0:
when survival path information P(0,0)=0 is given, M(−1, 0)=0 at time n−1 is obtained since it reaches state 0 at time n−1, further, when P(−1,0)=0, M(−2,0)=0 at time n−2 is obtained since it reaches state 0 at time n−2 and, when P(−1,0)=1, M(−2,0)=1 at time n−2 is obtained since it reaches state 5 at time n−2;
when survival path information P(0,0)−1 is given, M(−1, 0)=1 at time n−1 is obtained since it reaches state 5 at time n−1, further, M(−2,0)=2 at time n−2 is obtained since it surely reaches state 7 at time n−2.

To state 1:
when survival path information P(0,1)=0 is given, M(−1, 0)=1 at time n−1 is obtained since it reaches state 5 at time n−1, further, M(2,0)=2 at time n−2 is obtained since it surely reaches state 7 at time n−2.

To state 1:
when survival path information P(0,1)=0 is given, M(−1, 1)=0 at time n−1 is obtained since it reaches state 0 at time n−1, further, when P(−1,0)=0, M(−2,1)=0 at time n−2 is obtained since it reaches state 0 at time n−2 and, when P(−1,0)=1, M(−2,1)=1 at time n−2 is obtained since it reaches state 5 at time n−2;
when survival path information P(0,1)−1 is given, M(−1, 1)−1 at time n−1 is obtained since it reaches state 5 at time n−1, further, M(−2,1)−2 at time n−2 is obtained since it surely reaches state 7 at time n−2.

To state 2;
when survival path information P(0,2)=0 is given, M(−1, 2)=0 at time n−1 is obtained since it reaches state 1 at time n−1, further, when P(−1,1)−0, M(−2,2)=0 at time n−2 is obtained since it reaches state 0 at time n−2 and, when P(−1,1)−1, M(−2,2)=1 at time n−2 is obtained since it reaches state 5 at time n−2;

when survival path information P(0,2)=1 is given, M(−1, 2)=1 at time n−1 is obtained since it reaches state 6 at time n−1, further, M(−2,2)=2 at time n−2 is obtained since it surely reaches state 7 at time n−2.

To states 3, 4:
M(−1,3)=1, M(−1,4)=1 at time n−1 are obtained since it surely reaches state 2 at time n−1; further, when P(−1, 2)=0, M(−2,3)=0, M(−2,4)=0 at time n−2 are obtained since it reaches state 1 at time n−2, and, when P(−1, 2)=1, M(−2,3)=1, M(−2,4)=1 at time n−2 are obtained since it reaches state 6 at time n−2.

To states 5, 6:
M(−1,5)=2, M(−1,6)=2 at time n−1 are obtained since it surely reaches state 7 at time n−1;
further, when P(−1,7)=0, M(−2,5)=2, M(−2,6)=2 at time n−2 are obtained since it reaches state 3 at time n−2, and, when P(−1,7)=1, M(−2,5)=3, M(−2,6)=3 at time n−2 are obtained since it reaches state 8 at time n−2.

To state 7:
when survival path information P(0,7)=0 is given, M(−1, 7)=2 at time n−1 is obtained since it reaches state 3 at time n−1, further, M(−2,7)=1 at time n−2 is obtained since it surely reaches state 2 at time n−2;
when path information P(0,7)=1 is given, M(−1,7)=3 at time n−1 is obtained since it reaches state 8 at time n−1, further, when P(−1,8)=0, M(−2,7)=2 at time n−2 is obtained since it reaches state 4 at time n−2 and, when P(−1,8)=1, M(−2,7)=3 at time n−2 is obtained since it reaches state 9 at time n−2.

To state 8:
when survival path information P(0,8)=0 is given, M(−1, 8)=2 at time n−1 is obtained since it reaches state 4 at time n−1, further, M(−2,8)=1 at time n−2 is obtained since it surely reaches state 2 at time n−2;
when survival path information P(0,8)=1 is given, M(−1, 8)=3 at time n−1 is obtained since it reaches state 9 at time n−1, further, when P(−1,9)=0, M(−2,8)=2 at time n−2 is obtained since it reaches state 4 at time n−2 and, when P(−1,9)=1, M(−2,8)=3 at time n−2 is obtained since it reaches state 9 at time n−2.

To state 9:
when survival path information P(0,9)=0 is given, M(−1, 9)=2 at time n−1 is obtained since it reaches state 4 at time n−1, further, M(−2,9)=1 at time n−2 is obtained since it surely reaches state 2 at time n−2;
when survival path information P(0,9)=1 is given, M(−1, 9)=3 at time n−1 is obtained since it reaches state 9 at time n−1, further, when P(−1,9)=0, M(−2,9)=2 at time n−2 is obtained since it reaches state 4 at time n−2 and, when P(−1,9)=1, M(−2,9)=3 at time n−2 is obtained since it reaches state 9 at time n−2.

FIG. 15 shows an address list of RAM 4.

RAM 4 is provided with 5-clock estimate data compound of 3-clock path data and 2-clock previous data as addresses, and it uses, as data, an estimate digital level in the middle($3^{rd}$ clock of 5 clocks) of the 5-clock data that are recorded, reproduced and pre-equalized by PR(1,2,1).

Initial data are originally stored in RAM 4. The initial data may be values calculated from an impulse response or values when recording and reproducing in an ideal state.

Typically, the effect of reproduce data to adjacent signal can be represented by normal distribution:

$$\exp(-t^2/2\tau^2)$$

where t is time and $\tau^2$ is a dispersion whose approximate value is obtained by the recording in a real device. In accurate normal distribution, the above expression is divided by $(2\pi\tau^2)^{1/2}$. However, the above expression is used as it is as a relative value has only to be known herein.

RAM data are given as 5-clock level data by adding the effects from quaternary 5-clock data "4", "3", "1", "0", respectively to the center ($3^{rd}$ clock).

The effect from $1^{st}$, $5^{th}$ clock to $3^{rd}$ clock is:

for data "4", $4*\exp(-2(T_s)^2/2\tau^2)$ for data "3", $3*\exp(-2(T_s)^2/2\tau^2)$ for data "1", $\exp(-2(T_s)^2/2\tau^2)$ for data "0", 0

The effect from $2^{nd}$, $4^{th}$ clock to $3^{rd}$ clock is:

for data "4", $4*\exp(-T_s^2/2\tau^2)$ for data "3", $3*\exp(-T_s^2/2\tau^2)$ for data "1", $\exp(-T_s^2/2\tau^2)$ for data "0", 0

The effect from $3^{rd}$ clock is:

for data "4", 4 for data "3", 3 for data "1", 1 for data "0", 0 where $T_s$ is a symbol period.

The value is normalized within the range of −1 to +1 by using a level corresponding to the maximum value "44444". Namely, when the data are represented by "A1 A2 A3 A4 A5", the final level data are given by:

$$2\times \frac{A1\cdot\exp(-(2T_s)^2/2\tau^2)+A2\cdot\exp(-T_s^2/2\tau^2)+A3+A4\cdot\exp(-T_s^2/2\tau^2)+A5\cdot\exp(-(2T_s)^2/2\tau^2)]}{[8\cdot\exp(-(2T_s)^2/2\tau^2)+8\cdot\exp(-T_s^2/2\tau^2)+4]}-1$$

For example, when $\tau/Ts=0.6$ and 5-clock data of "10013" are given, the $3^{rd}$ clock final level data is given by:

$[1\cdot\exp(-2T_S)^2/2\tau^2)+1\cdot\exp(-T_S^2/2\tau^2)+3\cdot\exp(-(2T_S)^2/2\tau^2)]/[8\cdot$ $\exp(-(2T_S)^2/2\tau^2)+8\cdot\exp(-T_S^2/2\tau^2)+4]=[1\cdot\exp(-0.72)+1\cdot\exp(-0.18)+3\cdot$ $\exp(-0.72)]/[8\cdot\exp(+0.72)+8\cdot\exp(-0.18)$ $+4]=2X(2.782/14.576)-1=0.618$ In RAM 4, a value calculated as the above and rounded into about 6 bits is stored.

In FIG. 15, for a recording code with a minimum inversion interval of 2, all addresses to which the 5-clock data of 2-clock quaternary previous data and 3-clock quaternary path data may be assigned, and the corresponding RM(0) to RM(15) are shown.

Also in FIG. 14, in order to represent quaternary level (0, 1, 3, 4) shown in FIGS. 1 and 7 by 2-bit, "3" and "4" are represented by '2(10B)' and '3(11B)', respectively.

The path memory circuit 3, as shown in FIG. 12, stores tens of clocks of 6-bit survival path information and calculates 10-bit survival state information. Survival state information at time n is calculated from survival sate information at n+1, i.e., in the future and survival path information. As this calculation is conducted over tens of clocks, survival state information at tens of clocks before can be obtained. That one state of 10 states is survived indicates that paths are unified. When paths are unified to state 0, 1, the quaternary level is "0", when paths are unified to state 2, 5, 6, the quaternary level is "1", when paths are unified to state 3, 4, 7, the quaternary level is "3", and, when paths are unified to state 8, 9, the quaternary level is "4". Also, when paths are unified to state 0, 1, 2, 7, 8, 9, a binary output of "0" is obtained, and, when paths are unified to state 3, 4, 5, 6, a binary output of "1" is obtained.

However, even when calculating over tens of clocks, paths are not always unified. When paths are not unified, the quaternary level output Dout4 is given as a level corresponding to state with a maximum survival number of state 0, 1/2, 5, 6/3, 4, 7/8, 9, and the binary output Dout2 is given as a level corresponding to state with a more survival number of state 0, 1, 2, 7, 8, 9/3, 4, 5, 6.

Finally, examples of the RAM data correction circuit 6 will be explained.

In RAM 4, the estimate data to input data are stored. As the input data characteristic changes every second, estimate data prepared to input data also have to be changed according to this. However, if these are excessively accorded with input data, the estimate data may be also broken when a burst error occurs. Therefore, input data and old RAM data are weighted with respective weights, and then are added. Namely, using $\mu(0\leq\mu\leq1)$, new RAM data are obtained:

(new RAM data)=$\mu$×(input data)+(1−$\mu$)×(old RAM data)

Meanwhile, as address data for rewriting RAM data are obtained from path memory output, there occurs tens of stages of delays. Thus, the amount of input data delay needs to be synchronized with that.

Another example of the RAM data correction circuit 6 will be explained below. In this example, difference values obtained by subtracting old RAM data from input data are accumulated and, when the accumulated value exceeds a positive(+) threshold value, the RAM data are increased by one step, and when it is less than a negative(−) threshold value, the RAM data are decreased by one step, thereby minimizing the difference value. However, as address data for rewriting RAM data are obtained from path memory output, there occur tens of stages of delays. Thus, the amount of input data delay needs to be synchronized with that. The threshold value may be an arbitrary real number. Also, one step may be a digital level of "1" or another arbitrary real number.

Correction may be conducted only at data area other than track address, track jump, preamble, gap for edition etc. so as to reduce a wrong correction operation caused by an unstable operation, as much as possible. Also, it may be conducted only in case of a regular reproduction. Further, it may be conducted after recording and reproducing are stabilized. Still further, it may be conducted only when the error rate is less than a value. Still yet further, these methods may be combined.

Also, in order to reduce a wrong correcting operation when a code error occurs, correction may be conducted by designating, at first, a range where input data may vary from initial data preset in RAM, controlling to put within the range by a limiter or controlling to return to the preset value when it varies exceeding the range. Also, a variation range per one round may be limited and, when exceeding the variation range, it may be stopped at a maximum variation or a variation of that round may be prohibited. Furthermore, when a difference absolute value between input data and old RAM data is greater than a value, correcting operation or accumulation may be prohibited.

Next, preferred embodiments of the invention other than the above-mentioned first embodiment (corresponding to claim 17 defined later) will be briefly explained.

Figure 16:
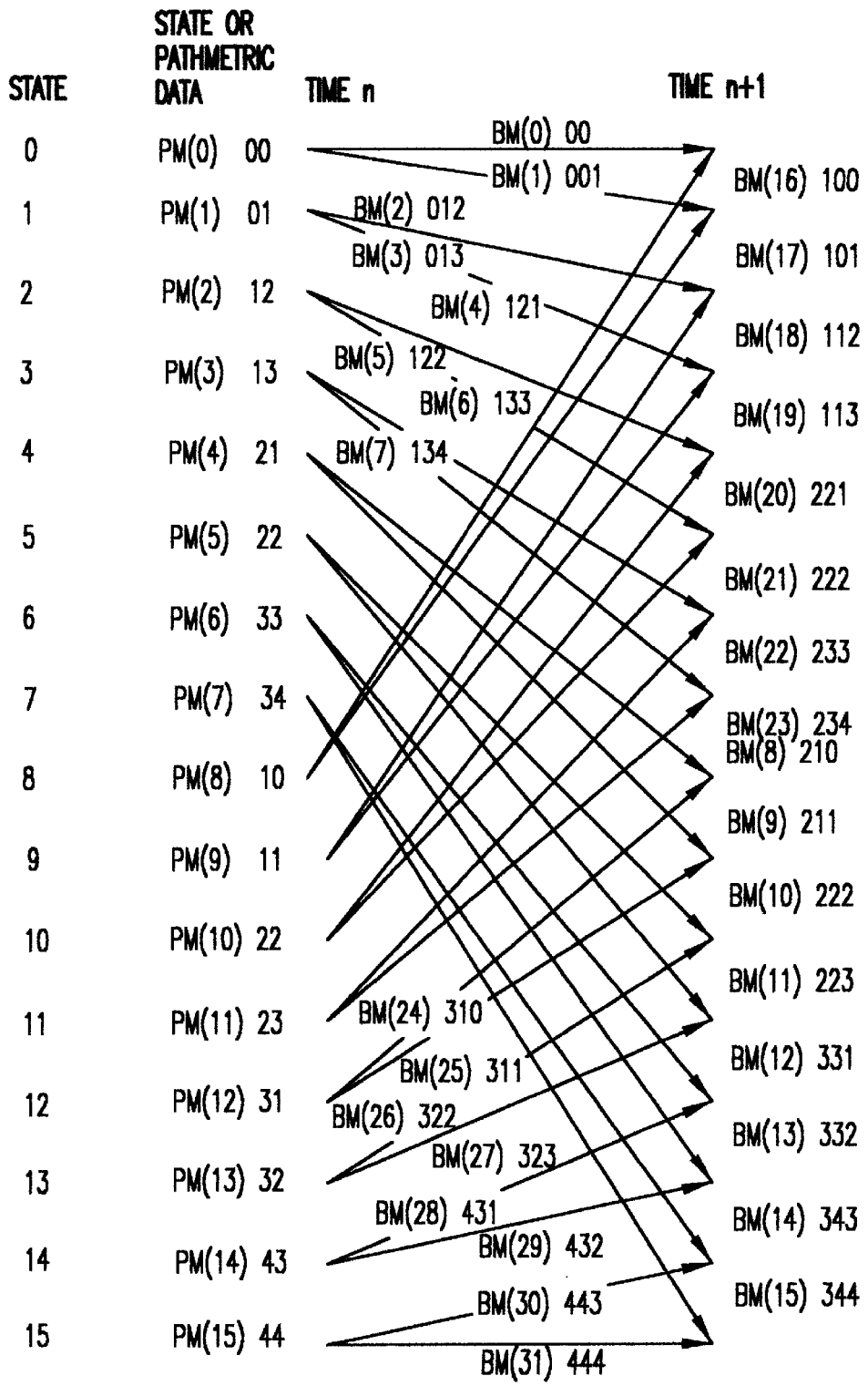
FIG. 16 is an illustration showing a state change (corresponding to claim 8) to each block under 3-clock path data, no condition of minimum inversion interval and PR(1,2,1) pre-equalization, where the lateral axis indicates time.

A data-reproducing device in the second preferred embodiment (corresponding to claim 15 defined later) of the invention will be explained. As to the second embodiment, FIG. 2 shows a state change to each clock and FIG. 16 shows a state change that the lateral axis indicates time.

In the second embodiment, the condition of minimum inversion interval in the first embodiment is removed. PR(1, 2,1) pre-equalization and reproduction data with 5-element (0,1,2,3,4) are used. Path data or branchmetrics are of 3-clock data:

000, 001, 012, 013, 100, 101, 112, 113, 121, 122, 133, 134, 210, 211, 221, 222, 223, 233, 234, 310, 311, 322, 323, 331, 332, 343, 344, 431, 432, 443, 444.

Stats or pathmetrics are of 2-clock data:

00, 01, 10, 11, 12, 13, 21, 22, 23, 31, 32, 33, 34, 43, 44.

The path selection and pathmetric unification are given by expanding the procedures in FIGS. 8 and 9 according to conditions in FIG. 16. The whole composition of the data-reproducing device in the second embodiment is similar to that shown in FIG. 10. The subtraction absolute value/ comparison and selection circuits are given by expanding the composition in FIG. 11 according to the conditions in FIG. 16. The path memory circuit is given by expanding the composition in FIG. 12 to have (P(0,0) to P(0,15) and S(0,0) to S(0,15) according to the conditions in FIG. 16.

FB0s for getting survival state informations S(0,0) to S(0,15) are given by expanding the compositions in FIG. 13 according to the conditions in FIG. 16, and FB1s for getting 2-clock previous data are given by expanding the composition in FIG. 14 according to the conditions in FIG. 16. RAM addresses are given by expanding those in FIG. 15 according to the conditions in FIG. 16. The RAM data correction circuit is similar to that in the first embodiment.

Figure 17:
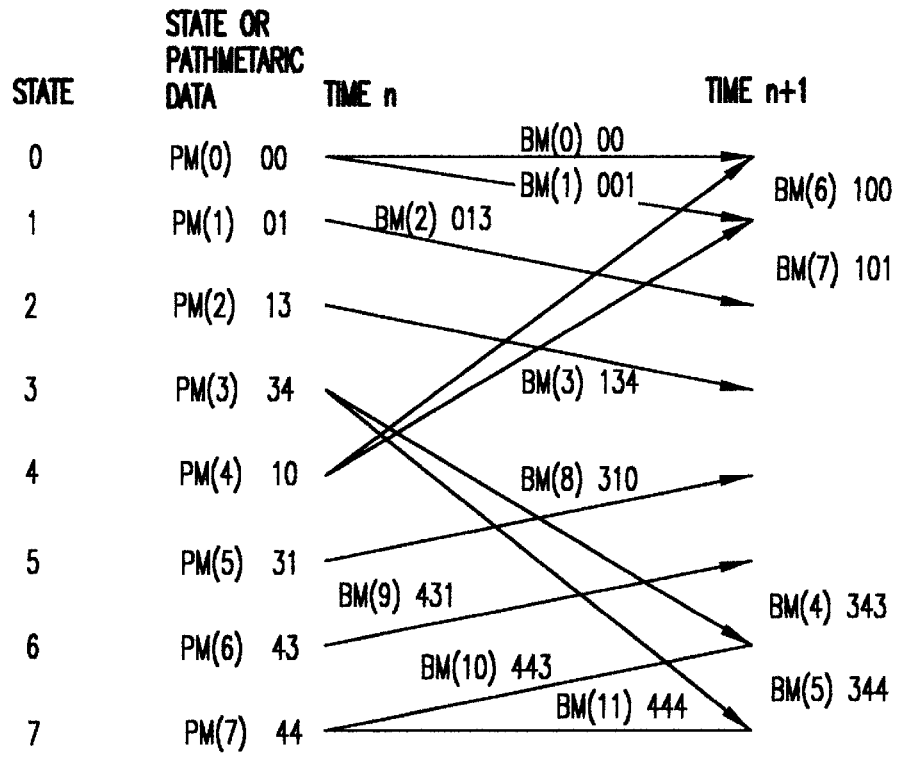
FIG. 17 is an illustration showing a state change (corresponding to claim 10) to each block under 3-clock path data, a minimum inversion interval of 3 and PR(1,2,1) pre-equalization, where the lateral axis indicates time.

A data-reproducing device in the third preferred embodiment (corresponding to claim 20 defined later) of the invention will be explained. As to the third embodiment, FIG. 3 shows a state change to each clock and FIG. 17 shows a state change that the lateral axis indicates time.

In the third embodiment, the minimum inversion interval is 3 in contrast to the first embodiment. PR (1,2,1) pre-equalization and reproduction data with 4-element (0,1,3,4) are used. Path data or branchmetrics are of 3-clock data:

000, 001, 013, 100, 101, 134, 310, 343, 344, 431, 443, 444.

States or pathmetrics are of 2-clock data:

00, 01, 10, 13, 31, 34, 43, 44.

The path selection and pathmetric unification are given by expanding the procedures in FIGS. 8 and 9 according to conditions in FIG. 17. The whole composition of the data-reproducing device in the third embodiment is similar to that shown in FIG. 10. The subtraction absolute value/ comparison and selection circuits are given by expanding the compositions in FIG. 11 according to the conditions in FIG. 17. The path memory circuit is given by expanding the composition in FIG. 12 to have P(0,0) to P(0,7) and S(0,0) to S(0,7) according to the condition in FIG. 17.

FB0s for getting survival state informations S(0,0) to S(0,7) are given by expanding the compositions in FIG. 13 according to the conditions in FIG. 17, and FB1s for getting 2-clock previous data are given by expanding the composition in FIG. 14 according to the conditions in FIG. 17. RAM addresses are given by expanding those in FIG. 15 according to the conditions in FIG. 17. The RAM data correction circuit is similar to that in the first embodiment.

Figure 18:
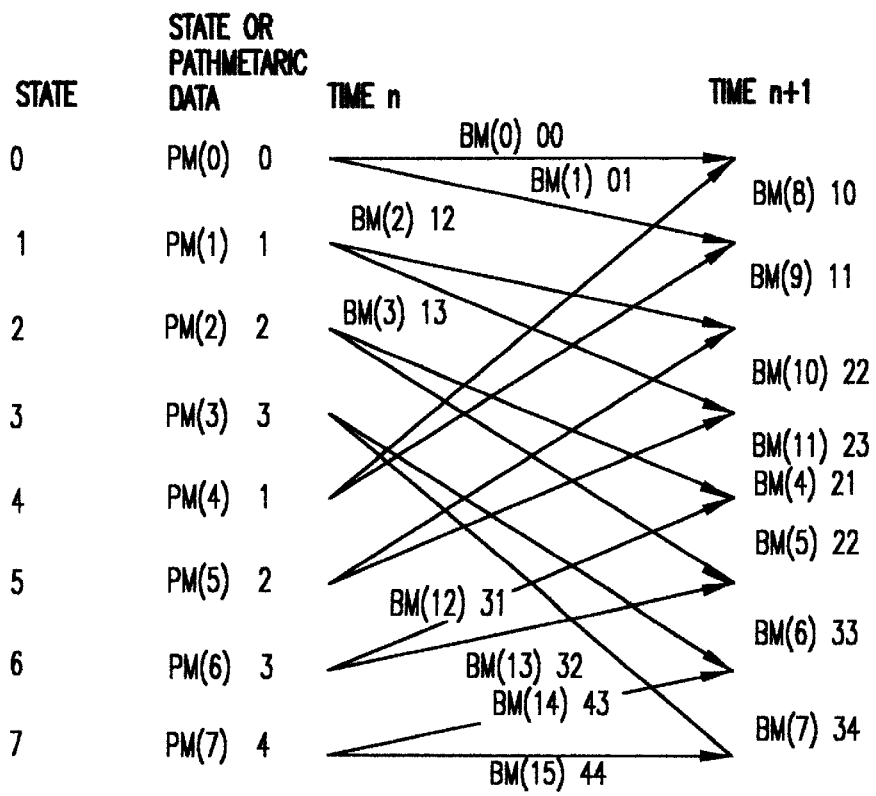
FIG. 18 is an illustration showing a state change (corresponding to claim 7) to each block under 2-clock path data, no condition of minimum inversion interval and PR(1,2,1) pre-equalization, where the lateral axis indicates time.

A data-reproducing device in the fourth preferred embodiment (corresponding to claim 7 defined later) of the invention will be explained. As to the fourth embodiment, FIG. 2 shows a state change to each clock and FIG. 18 shows a state change that the lateral axis indicates time.

In the fourth embodiment, the condition of minimum inversion interval is removed and path data or branchmetrics are reduced to 2-clock, in contrast to the first embodiment. The number of states is 8. S0 to S7 in FIG. 2 are corresponding to states 0 to 7 in FIG. 18. PR(1,2,1) pre-equalization and reproduction data with 5-element (0,1,2,3, 4) are used. Path data or branchmetrics are of 2-clock data:

00, 01, 10, 11, 12 13, 21, 22, 23, 31, 32, 33, 34, 43, 44

States or pathmetrics are of 1-clock data:

0, 1, 2, 3, 4.

The path selection and pathmetric unification are given by expanding the procedures in FIGS. 8 and 9 according to conditions in FIG. 18. The whole composition of the data-reproducing device in the fourth embodiment is similar to that shown in FIG. 10. The subtraction absolute value/ comparison and selection circuits are given by expanding the compositions in FIG. 11 according to the conditions in FIG. 18. The path memory circuit is given by expanding the composition in FIG. 12 to have P(0,0) to P(0,7) and S(0,0) to S(0,7) according to the conditions in FIG. 18.

FB0s for getting survival state informations S(0,0) to S(0,7) are given by expanding the compositions in FIG. 13 according to the conditions in FIG. 18, and FB1s for getting 2-clock previous data are given by expanding the composition in FIG. 14 according to the conditions in FIG. 18. RAM addresses are given by expanding those in FIG. 15 according to the conditions in FIG. 18. The RAM data correction circuit is similar to that in the first embodiment.

Figure 19:
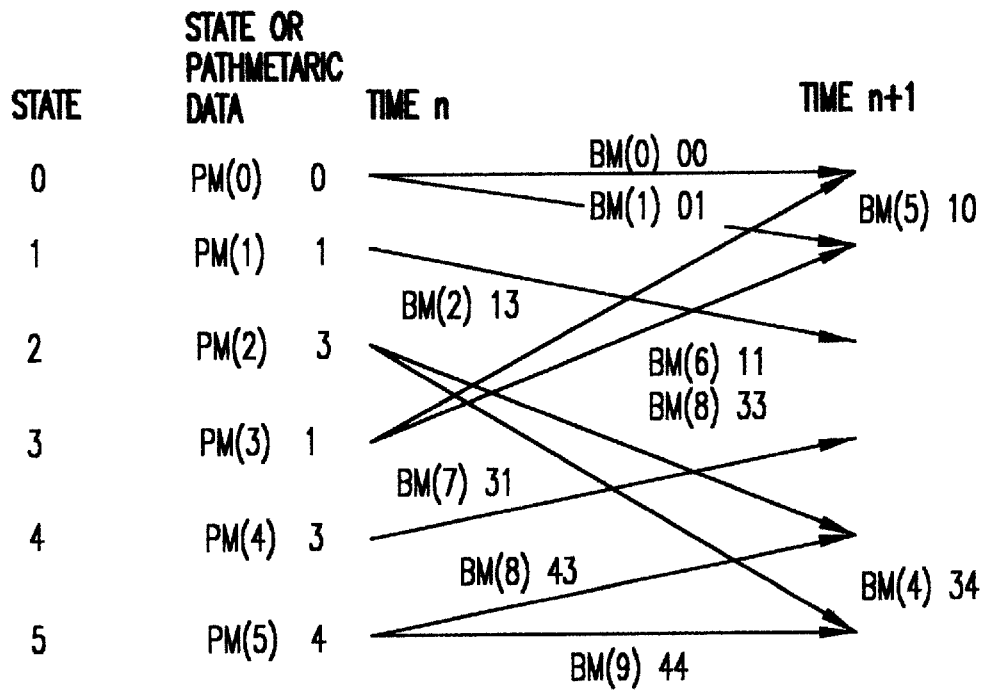
FIG. 19 is an illustration showing a state change (corresponding to claim 9) to each block under 2-clock path data, a minimum inversion interval of 2 and PR(1,2,1) pre-equalization, where the lateral axis indicates time.

A data-reproducing device in the fifth preferred embodiment (corresponding to claim 9 defined later) of the invention will be explained. As to the fifth embodiment, FIG. 1 shows a state change to each clock and FIG. 19 shows a state change that the lateral axis indicates time.

In the fifth embodiment, the minimum inversion interval is 2 and path data or branchmetrics are reduced to 2-clock, in contrast to the first embodiment. The number of states is 6. S0 to S5 in FIG. 2 are corresponding to states 0 to 5 in FIG. 19. PR(1,2,1) pre-equalization and reproduction data with 4-element (0,1,3,4) are used. Path data or branchmetrics are of 2-clock data:

00, 01, 10, 11, 13, 31, 33, 34, 43, 44

States or pathmetrics are of 1-clock data:

0, 1, 3, 4.

The path election and pathmetric unification are given by expanding the procedures in FIGS. 8 and 9 according to conditions in FIG. 19. The whole composition of the data-reproducing device in the fifth embodiment is similar to that shown in FIG. 10. The subtraction absolute value/ comparison and selection circuits are given by expanding the compositions in FIG. 11 according to the conditions in FIG. 19. The path memory circuit is given by expanding the composition in FIG. 12 to have P(0,0) to P(0,5) and S(0,0) to S(0,5) according to the conditions in FIG. 19.

FB0s for getting survival state informations S(0,0) to S(0,5) are given by expanding the composition in FIG. 13 according to the conditions in FIG. 19, and FB1s for getting 2-clock previous data are given by expanding the composition in FIG. 14 according to the conditions in FIG. 19. RAM addresses are given by expanding those in FIG. 15 according to the conditions in FIG. 19. The RAM data correction circuit is similar to that in the first embodiment.

Figure 20:
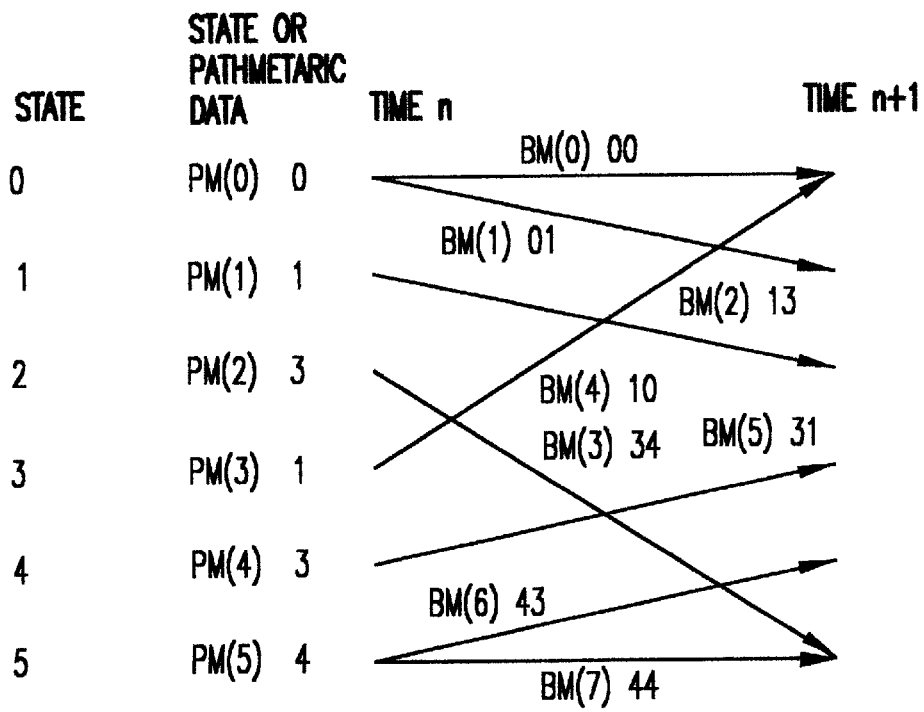
FIG. 20 is an illustration showing a state change (corresponding to claim 12) to each block under 2-clock path data, a minimum inversion interval of 3 and PR(1,2,1) pre-equalization, where the lateral axis indicates time.

A data-reproducing device in the sixth preferred embodiment (corresponding to claim 12 defined later) of the invention will be explained. As to the sixth embodiment, FIG. 3 shows a state change to each clock and FIG. 20 shows a state change that the lateral axis indicates time.

In the sixth embodiment, the minimum inversion interval is 2 and path data or branchmetrics are reduced to 2-clock, in contrast to the first embodiment. The number of states is 6. S0 to S5 in FIG. 3 are corresponding to states 0 to 5 in FIG. 20. PR(1,2,1) pre-equalization and reproduction data with 4-element (0,1,3,4) are used. Path data or branchmetrics are of 2-clock data:

00, 01, 10, 13, 31, 34, 43, 44

States of pathmetrics are of 1-clock data:

0, 1, 3, 4.

The path selection and pathmetric unification are given by expanding the procedures in FIGS. 8 and 9 according to conditions in FIG. 20. The whole composition of the data-reproducing device in the sixth embodiment is similar to that shown in FIG. 10. The subtraction absolute value/comparison and selection circuits are given by expanding the compositions in FIG. 11 according to the conditions in FIG. 20. The path memory circuit is given by expanding the composition in FIG. 12 to have P(0,0) to P(0,5) and S(0,0) to S(0,5) according to the conditions in FIG. 20.

FB0s for getting survival state informations S(0,0) to S(0,5) are given by expanding the compositions in FIG. 13 according to the conditions in FIG. 20, and FB1s for getting 2-clock previous data are given by expanding the composition in FIG. 14 according to the conditions in FIG. 20. RAM addresses are given by expanding those in FIG. 15 according to the conditions in FIG. 20. The RAM data correction circuit is similar to that in the first embodiment.

Figure 21:
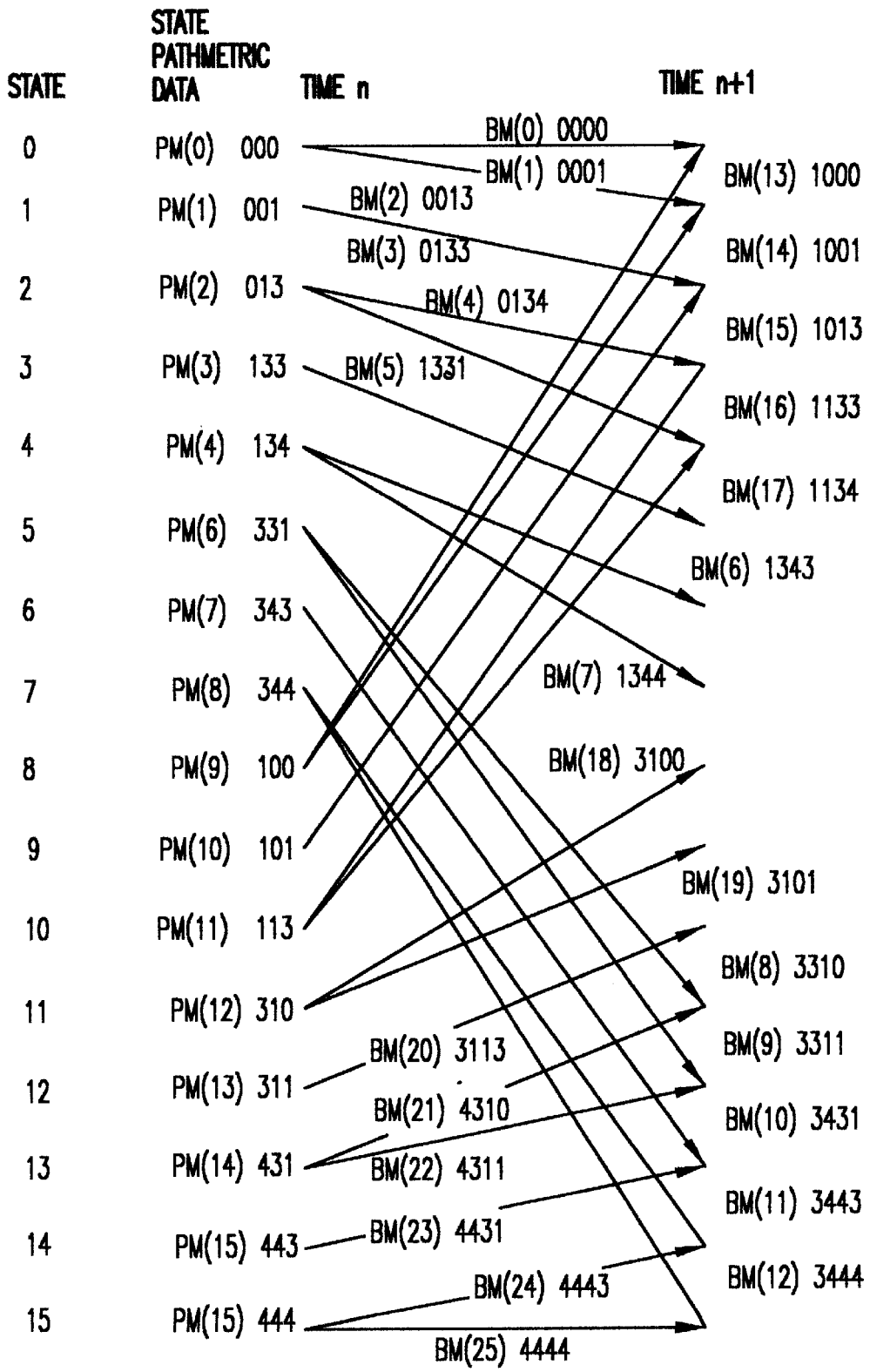
FIG. 21 is an illustration showing a state change (corresponding to claim 23) to each block under 4-clock path data, a minimum inversion interval of 2 and PR(1,2,1) pre-equalization, where the lateral axis indicates time.

A data-reproducing device in the seventh preferred embodiment (corresponding to claim 23 defined later) of the invention will be explained. As to the seventh embodiment, FIG. 1 shows a state change to each clock and FIG. 21 shows a state change that the lateral axis indicates time.

In the seventh embodiment, the minimum inversion interval is 2 and path data or branchmetrics are expanded to 4-clock, in contrast to the first embodiment. PR(1,2,1) pre-equalization and reproduction data with 4-element (0,1, 3,4) are used. Path data or branchmetrics are of 4-clock data:

0000, 0001, 0013, 0133, 0134, 1000, 1001, 1013, 1133, 1134, 1331, 1343, 1344, 3100, 3101, 3113, 3310, 3311, 3431, 3443, 3444, 4310, 4311, 4431, 4443, 4444.

States or pathmetrics are of 3-clock data:

000, 001, 013, 100, 101, 113, 133, 134, 310, 311, 331, 343, 344, 431, 443, 444.

The path selection and pathmetric unification are given by expanding the procedures in FIGS. 8 and 9 according to conditions in FIG. 21. The whole composition of the data-reproducing device in the seventh embodiment is similar to that shown in FIG. 10. The subtraction absolute value/comparison and selection circuits are given by expanding the compositions in FIG. 11 according to the conditions in FIG. 21. The path memory circuit is given by expanding the composition in FIG. 12 to have P(0,0) to P(0,15) and S(0,0) to S(0,15) according to the conditions in FIG. 21.

FB0s for getting survival state informations S(0,0) to S(0,15) are given by expanding the compositions in FIG. 13 according to the conditions in FIG. 21, and FB1s for getting 2-clock previous data are given by expanding the composition in FIG. 14 according to the conditions in FIG. 21. RAM addresses are given by expanding those in FIG. 15 according to the conditions in FIG. 21. The RAM data correction circuit is similar to that in the first embodiment.

Figure 22:
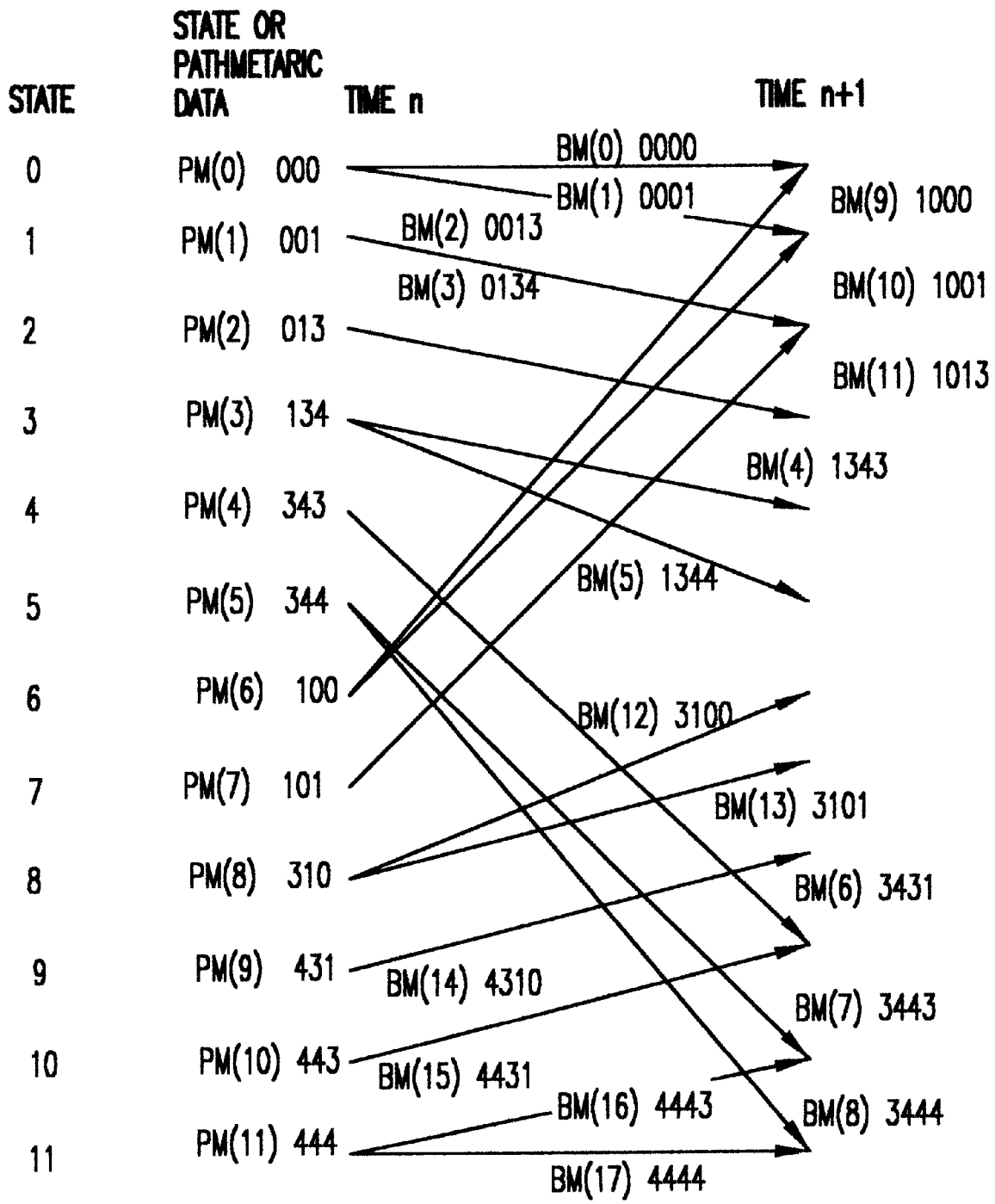
FIG. 22 is an illustration showing a state change (corresponding to claim 26) to each block under 4-clock path data, a minimum inversion interval of 3 and PR(1,2,1) pre-equalization, where the lateral axis indicates time.

A data-reproducing device in the eight preferred embodiment (corresponding to claim 15 defined later) of the invention will be explained. As to the eight embodiment, FIG. 3 shows a state change to each clock and FIG. 22 shows a state change that the lateral axis indicates time.

In the eighth embodiment, the minimum inversion interval is 3 and path data or branchmetrics are expanded to 4-clock, in contrast to the first embodiment. PR(1,2,1) pre-equalization and reproduction data with 4-element (0,1, 3,4) are used. Path data or branchmetrics are of 4-clock data:

000, 0001, 0013, 0134, 1000, 1001, 1013, 1343, 1344, 3100, 3101, 3431, 3443, 3444, 4310, 4431, 4443, 4444.

States or pathmetrics are of 3-clock data:

000, 001, 013, 100, 101, 134, 310, 343, 344, 431, 443, 444.

The path selection and pathmetric unification are given by expanding the procedures in FIGS. 8 and 9 according to conditions in FIG. 22. The whole composition of the data-reproducing device in the eighth embodiment is similar to that shown in FIG. 10. The subtraction absolute value/comparison and selection circuits are given by expanding the compositions in FIG. 11 according to the conditions in FIG. 22. The path memory circuit is given by expanding the composition in FIG. 12 to have P(0,0) to P(0,11) and S(0,0) to S(0,11) according to the conditions in FIG. 22.

FB0s for getting survival state informations S(0,1) to S(0,11) are given by expanding the compositions in FIG. 13 according to the conditions in FIG. 22, and FB1s for getting 2-clock previous data are given by expanding the composition in FIG. 14 according to the conditions in FIG. 22. RAM addresses are given by expanding those in FIG. 15 according to the conditions in FIG. 22. The RAM data correction circuit is similar to that in the first embodiment.

In the above embodiments, path data or branchmetrics may be of 1-clock, path data or branchmetrics may be of 4-clock or more without the condition of minimum inversion interval, or path data or branchmetrics may be of 5-clock or more with a minimum inversion interval of 2 or 3 (corresponding to claim 29, 33 defined later). According to these, state changes can be illustrated in like manner. The output data can be calculated by reducing or expanding FIGS. 8 to 15.

Next, the operation of PR(1,2,2,1) pre-equalization will be described with regard to the following ninth preferred embodiment of the invention. As described earlier, the priority of equalization such as PR(1,1), PR(1,2,1) and PR(1,2,2,1) is changed depending on optical disk characteristic. Namely, PR(1,2,2,1) is used when the optical disk characteristic has a priority as to PR(1,2,2,1).

A data-reproducing device in the ninth preferred embodiment (corresponding to claim 57 defined later) of the invention will be explained. As to the ninth embodiment, FIG. 4 shows a state change to each clock and FIG. 23 shows a state change that the lateral axis indicates time.

In the ninth embodiment, the minimum inversion interval is 2 and PR(1,2,2,1) pre-equalization is used, in contrast to the first embodiment. Reproduction data are of 7-element (0,1,2,3,4,5,6) as shown in FIG. 4. Of numerals on the arrow lines from a state to a state in FIGS. 4 to 6, the denominator represents a 7-element level and the numerator represents a binary output.

Figure 23:
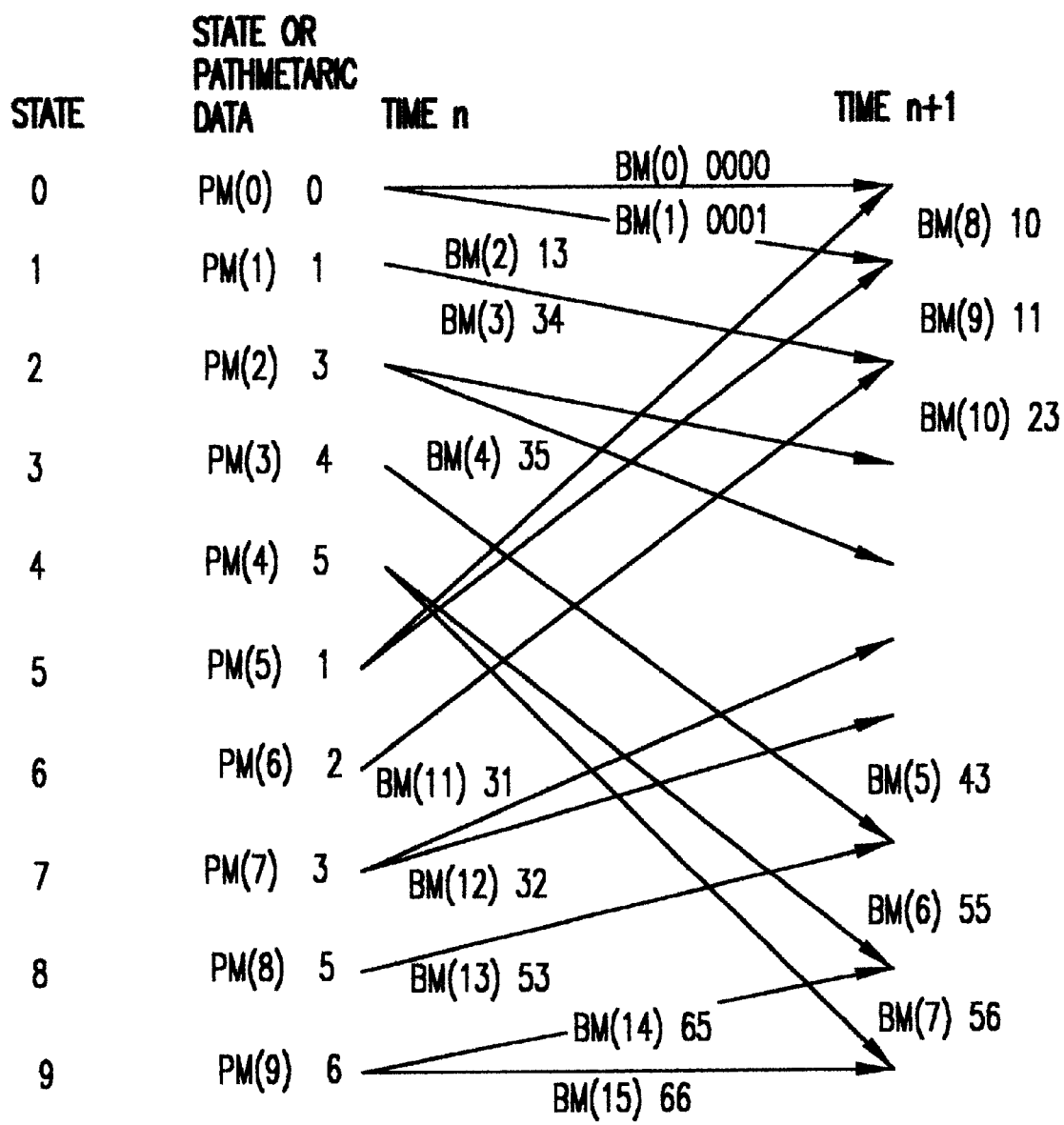
FIG. 23 is an illustration showing a state change (corresponding to claim 57) to each block under 2-clock path data, a minimum inversion interval of 2 and PR(1,2,2,1) pre-equalization, where the lateral axis indicates time.

Referring to FIG. 23, 7-element levels corresponding to the respective states can be known. It is the first clock of state or pathmetric. Namely, when paths are unified to sate 0 the 7-element level is "0". When paths are unified to state 1,5, 7-element level is "1". When paths are unified to state 6, the 7-element level is "2". When paths are unified to state 2, 7, the 7-element level is "3". When paths are unified to state 3, the 7-element level is "4". When paths are unified to state 4, 8, the 7-element level is "5". When paths are unified to state 9, the 7-element level is "6". In like manner, these are also applicable to FIGS. 24 to 30 explained later.

Figure 4:
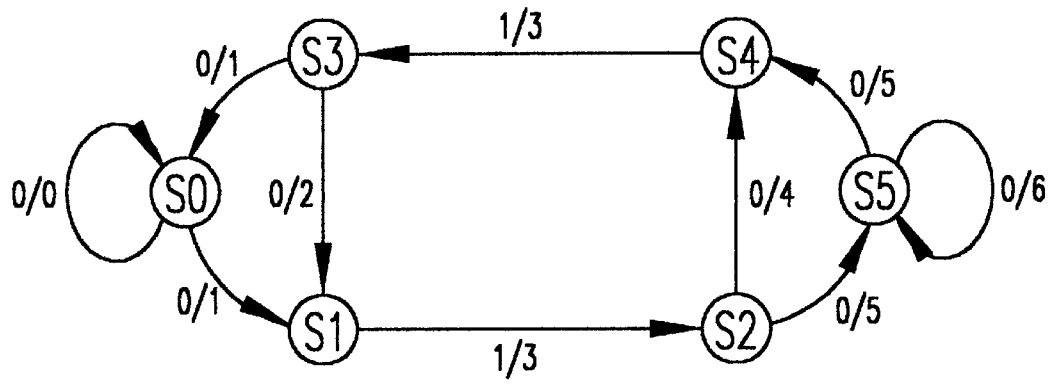
FIG. 4 is an illustration showing a state change to each block under the conditions of a minimum inversion interval of 2 and PR(1,2,2,1) pre-equalization.

Also, from numerator data in FIG. 4, binary outputs corresponding to the respective states can be known.

Namely, the binary output is "1" when paths are unified to state 3, 4, 5 and 6 that is reached at the next clock of BM(2) "13", BM(5) "43", BM(10) "23", BM(13) "53" which are path data, branchmetrics in FIG. 23, and the binary output is "0" when unified to the other states 0, 1, 2, 7, 8 and 9. In like manner, these are also applicable to FIGS. 5, 6 and 24 to 30 explained later.

In the ninth embodiment, path data or branchmetrics are of 2-clock data:

00, 01, 10, 11, 13, 23, 31, 32, 34, 35, 43, 53, 55, 56, 65, 66.

States or pathmetrics are of 1-clock data:

0, 1, 2, 3, 4, 5, 6.

The path selection and pathmetric unification are given by expanding the procedures in FIGS. 8 and 9 according to conditions in FIG. 23. The whole composition of the data-reproducing device in the ninth embodiment is similar to that shown in FIG. 10. The subtraction absolute value/comparison and selection circuits are given by expanding the compositions in FIG. 11 according to the conditions in FIG. 23. The path memory circuit is given by expanding the composition in FIG. 12 to have P(0,0) to P(0,9) and S(0,0) to S(0,9) according to the conditions in FIG. 23.

FB0s for getting survival state informations S(0,0) to S(0,9) are given by expanding the compositions in FIG. 13 according to the conditions in FIG. 23, and FB1s for getting 2-clock previous data are given by expanding the composition in FIG. 14 according to the conditions in FIG. 23. RAM addresses are given by expanding those in FIG. 15 according to the conditions in FIG. 23. The RAM data correction circuit is similar to that in the first embodiment.

Figure 5:
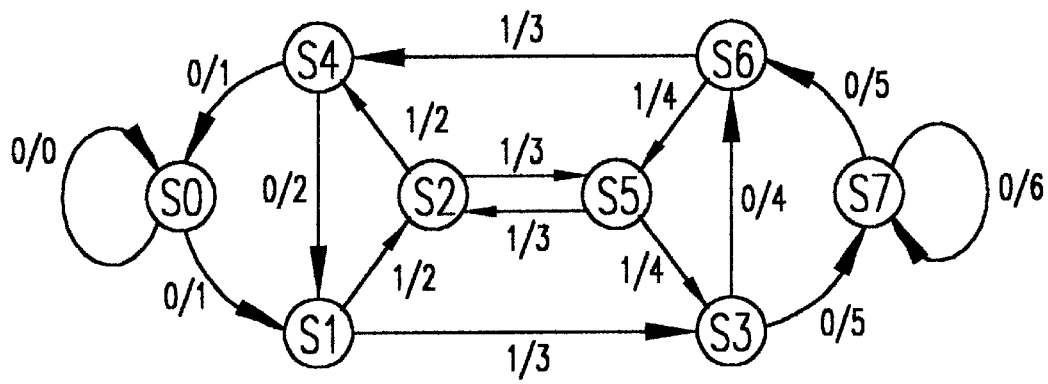
FIG. 5 is an illustration showing a state change to each block under no condition of minimum inversion interval and PR(1,2,2,1) pre-equalization.
Figure 24:
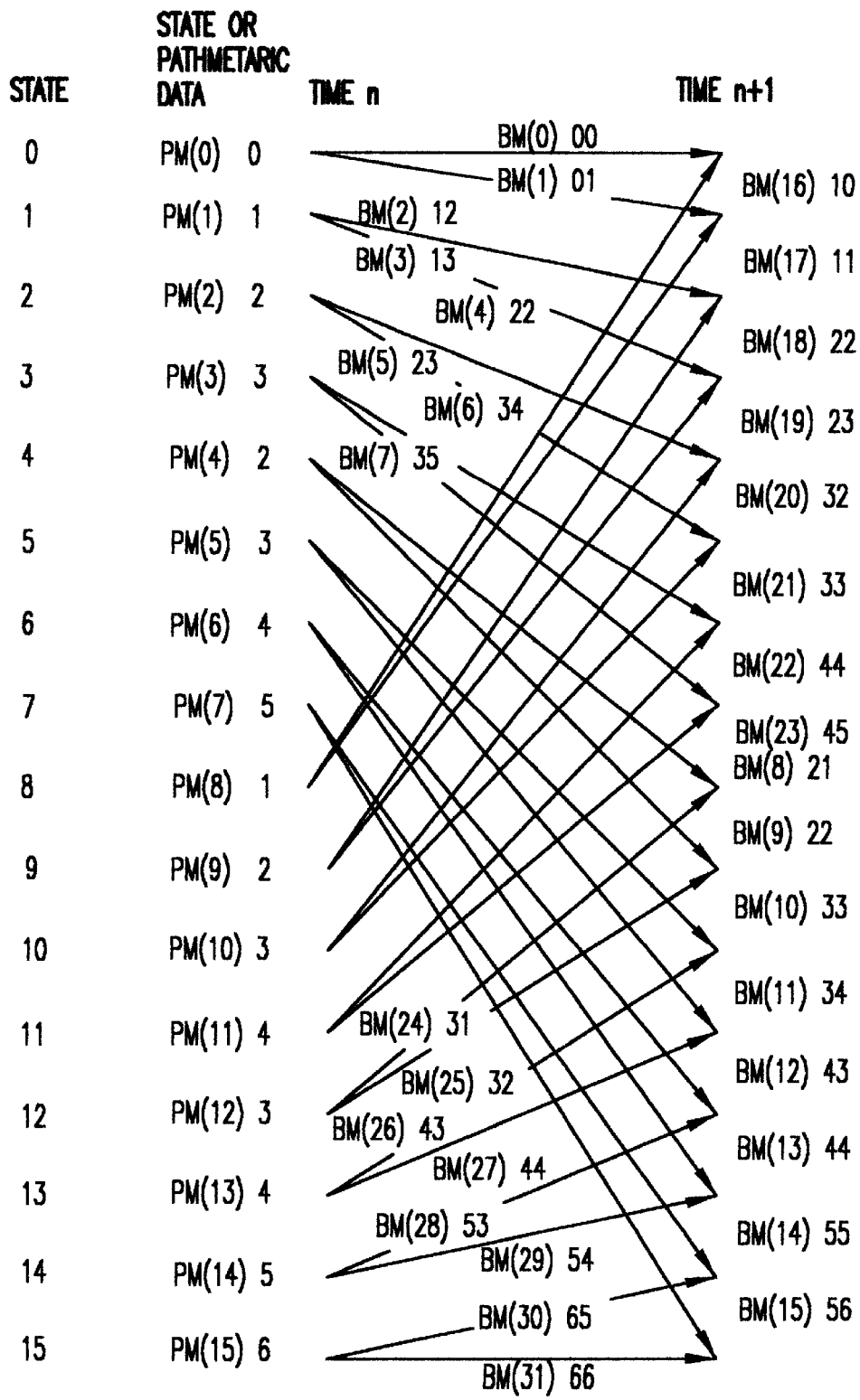
FIG. 24 is an illustration showing a state change (corresponding to claim 54) to each block under 2-clock path data, no condition of minimum inversion interval and PR(1,2,2,1) pre-equalization, where the lateral axis indicates time.

A data-reproducing device in the tenth preferred embodiment (corresponding to claim 54 defined later) of the invention will be explained. As to the tenth embodiment, FIG. 5 shows a state change to each clock and FIG. 24 shows a state change that the lateral axis indicates time.

In the tenth embodiment, the condition of the minimum inversion interval is removed in contrast to the ninth embodiment. PR(1,2,2,1) pre-equalization and reproduction data with 7-element (0,1,2,3,4,5,6) are used. Path data or branchmetrics are of 2-clock data:

00, 01, 10, 11, 12, 13, 21, 22, 23, 31, 32, 33, 34, 35, 43, 44, 45, 53, 54, 55, 56, 65, 66.

States or pathmetrics are of 1-clock data:

0, 1, 2, 3, 4, 5, 6.

The path selection and pathmetric unification are given by expanding the procedures in FIGS. 8 and 9 according to conditions in FIG. 24. The whole composition of the data-reproducing device in the tenth embodiment is similar to that shown in FIG. 10. The subtraction absolute value/comparison and selection circuits are given by expanding the compositions in FIG. 11 according to the conditions in FIG. 24. The path memory circuit is given by expanding the composition in FIG. 12 to have P(0,0) to P(0,15) and S(0,0) to S(0,15) according to the conditions in FIG. 24.

FB0s for getting survival state information S(0,0) to S(0,15) are given by expanding the compositions in FIG. 13 according to the conditions in FIG. 24, and FB1s for getting 2-clock previous data are given by expanding the composition in FIG. 14 according to the conditions in FIG. 24. RAM addresses are given by expanding those in FIG. 15 according to the conditions in FIG. 24. The RAM data correction circuit is similar to that in the first embodiment.

Figure 6:
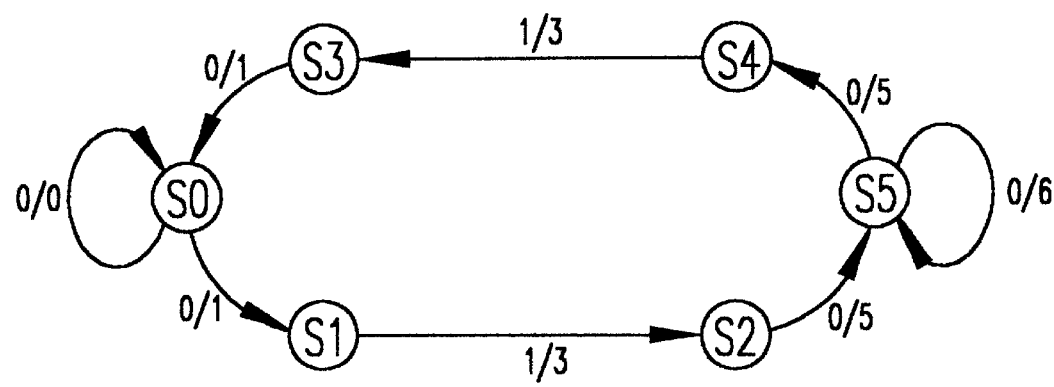
FIG. 6 is an illustration showing a state change to each block under the conditions of a minimum inversion interval of 3 and PR(1,2,2,1) pre-equalization.
Figure 25:
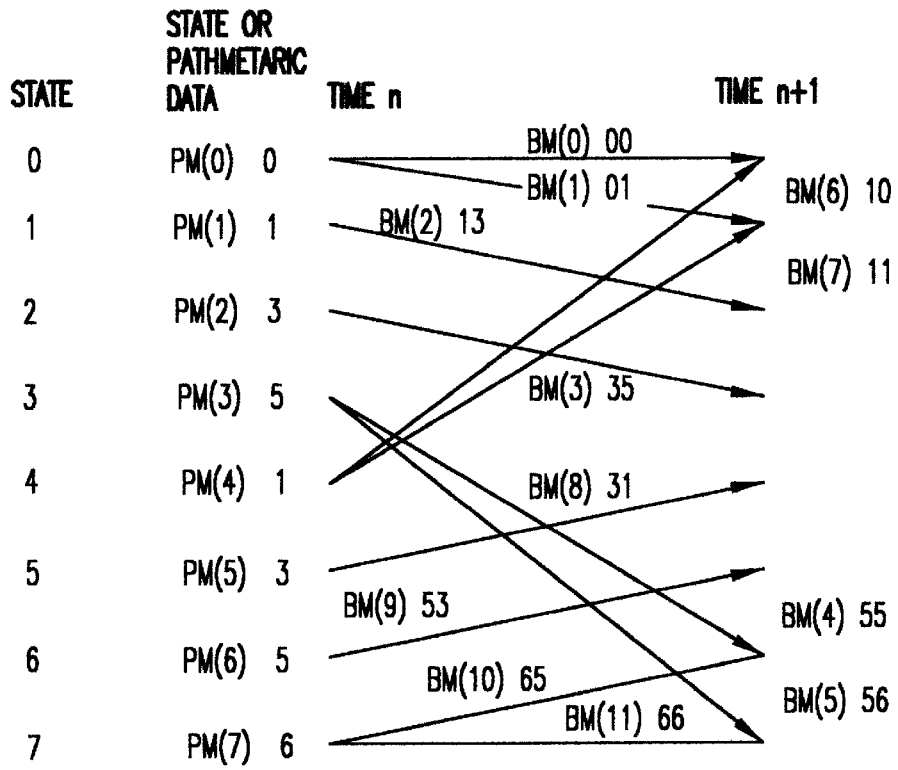
FIG. 25 is an illustration showing a state change (corresponding to claim 60) to each block under 2-clock path data, a minimum inversion interval of 3 and PR(1,2,2,1) pre-equalization, where the lateral axis indicates time.

A data-reproducing device in the eleventh preferred embodiment (corresponding to claim 60 defined later) of the invention will be explained. As to the eleven embodiment, FIG. 6 shows a state change to each clock and FIG. 25 shows a state change that the lateral axis indicates time.

In the eleventh embodiment, the minimum inversion interval is 3 in contrast to the ninth embodiment. PR(1,2,2,1) pre-equalization and reproduction data with 5-element (0,1,3,5,6) are used. Path data or branchmetrics are of 2-clock data:

00, 01, 10, 11, 13, 31, 35, 53, 55, 56, 65, 66.

States or pathmetrics are of 1-clock data:

0, 1, 3, 5, 6.

The path selection and pathmetric unification are given by expanding the procedures in FIGS. 8 and 9 according to conditions in FIG. 25. The whole composition of the data-reproducing device in the eleventh embodiment is similar to that shown in FIG. 10. The subtraction absolute value/comparison and selection circuits are given by expanding the compositions in FIG. 11 according to the conditions in FIG. 25. The path memory circuit is given by expanding the composition in FIG. 12 to have P(0,0) to P(0,7) and S(0,0) to S(0,7) according to the conditions in FIG. 25.

FB0s for getting survival state informations S(0,0) to S(0,7) are given by expanding the compositions in FIG. 23 according to the conditions in FIG. 25, and FB1s for getting 2-clock previous data are given by expanding the composition in FIG. 14 according to the conditions in FIG. 25. RAM addresses are given by expanding those in FIG. 15 according to the conditions in FIG. 25. The RAM data correction circuit is similar to that in the first embodiment.

A data-reproducing device in the twelfth preferred embodiment (corresponding to claim 45 defined later) of the invention will be explained. As to the twelfth embodiment, FIG. 5 shows a state change to each clock and FIG. 26 shows a state change that the lateral axis indicates time.

In the twelfth embodiment, the conditions of minimum inversion interval is removed and the path data or branchmetrics are reduce to 1-clock, in contrast to the ninth embodiment. The number of states is 8. S0 to S7 to FIG. 5 are corresponding to states 0 to 7 in FIG. 26. PR(1,2,2,1) pre-equalization and reproduction data with 7-element (0,1,2,3,4,5,6) are used. Path data or branchmetrics are of 1-clock data:

0, 1, 2, 3, 4, 5, 6.

Figure 26:
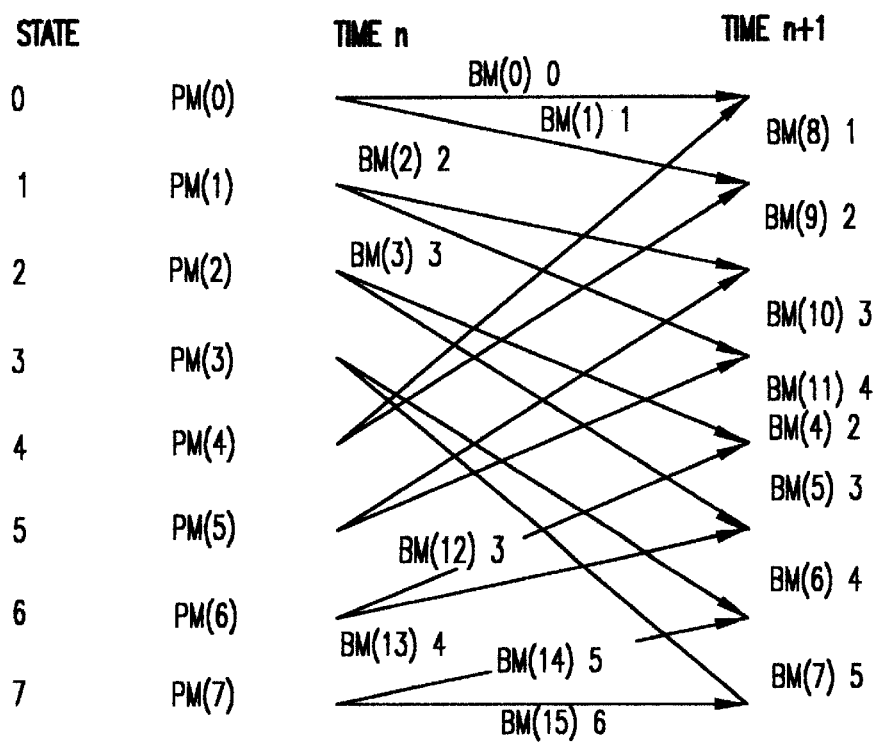
FIG. 26 is an illustration showing a state change (corresponding to claim 45) to each block under 1-clock path data, no condition of minimum inversion interval and PR(1,2,2,1) pre-equalization, where the lateral axis indicates time.

The path selection and pathmetric unification are given by expanding the procedures in FIGS. 8 and 9 according to conditions in FIG. 26. The whole composition of the data-reproducing device in the twelfth embodiment is similar to that shown in FIG. 10. The subtraction absolute value/comparison and selection circuits are given by expanding the compositions in FIG. 11 according to the conditions in FIG. 26. The path memory circuit is given by expanding the composition in FIG. 12 to have P(0,0) to P(0,7) and S(0,0) to S(0,7) according to the conditions in FIG. 26.

FB0s for getting survival state informations S(0,0) to S(0,7) are given by expanding the compositions in FIG. 13 according to the conditions in FIG. 26, and FB1s for getting 2-clock previous data are given by expanding the composition in FIG. 14 according to the conditions in FIG. 26. RAM addresses are given by expanding those in FIG. 15 according to the conditions in FIG. 26. The RAM data correction circuit is similar to that in the first embodiment.

A data-reproducing device in the thirteenth preferred embodiment (corresponding to claim 48 defined later) of the invention will be explained. As to the thirteenth embodiment, FIG. 4 shows a state change to each clock and FIG. 27 shows a state change that the lateral axis indicates time.

In the thirteenth embodiment, the minimum inversion interval is 2 and the path data branchmetrics are reduced to 1-clock, in contrast to the ninth embodiment. The number of states is 6. S0 to S5 in FIG. 4 are corresponding to states 0 to 5 in FIG. 27. PR(1,2,2,1) pre-equalization and reproduction data with 7-element (0,1,2,3,4,5,6) are used. Path data or branchmetrics are of 1-clock data:

0, 1, 2, 3, 4, 5, 6.

Figure 27:
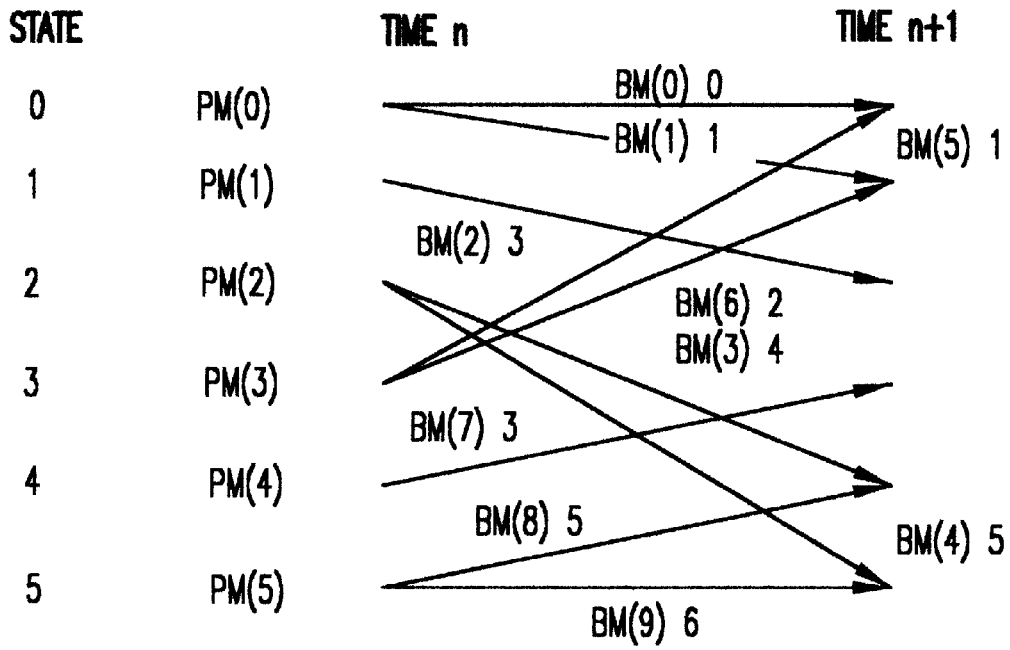
FIG. 27 is an illustration showing a state change (corresponding to claim 48) to each block under 1-clock path data, a minimum inversion interval of 2 and PR(1,2,2,1) pre-equalization, where the lateral axis indicates time.

The path selection and pathmetric unification are given by expanding the procedures in FIGS. 8 and 9 according to conditions in FIG. 27. The whole composition of the data-reproducing device in the thirteenth embodiment is similar to that shown in FIG. 10. The subtraction absolute value/comparison and selection circuits are given by expanding the compositions in FIG. 11 according to the conditions in FIG. 27. The path memory circuit is given to expanding the composition in FIG. 12 to have P(0,0) to P(0,5) and S(0,0) to S(0,5) according to the conditions in FIG. 27.

FB0s for getting survival state informations S(0,0) to S(0,5) are given by expanding the compositions in FIG. 13 according to the conditions in FIG. 27, and FB1s for getting 2-clock previous data are given by expanding the composition in FIG. 14 according to the conditions in FIG. 27. RAM addresses are given by expanding those in FIG. 15 according to the conditions in FIG. 27. The RAM data correction circuit is similar to that in the first embodiment.

A data-reproducing device in the fourteenth preferred embodiment (corresponding to claim 51 defined later) of the invention will be explained. As to the thirteenth embodiment, FIG. 6 shows a state change to each clock and FIG. 28 shows a sate change that the lateral axis indicates time.

In the fourteenth embodiment, the minimum inversion interval is 3 and the path data or branchmetrics are reduced to 1-clock, in contrast to the ninth embodiment. The number of states is 6. S0 to S5 in FIG. 6 are corresponding to states 0 to 5 in FIG. 28. PR(1,2,2,1) pre-equalization and reproduction data with 5-element (0,1,3,5,6) are used. Path data or branchmetrics are of 1-clock data:

0, 1, 3, 5, 6.

Figure 28:
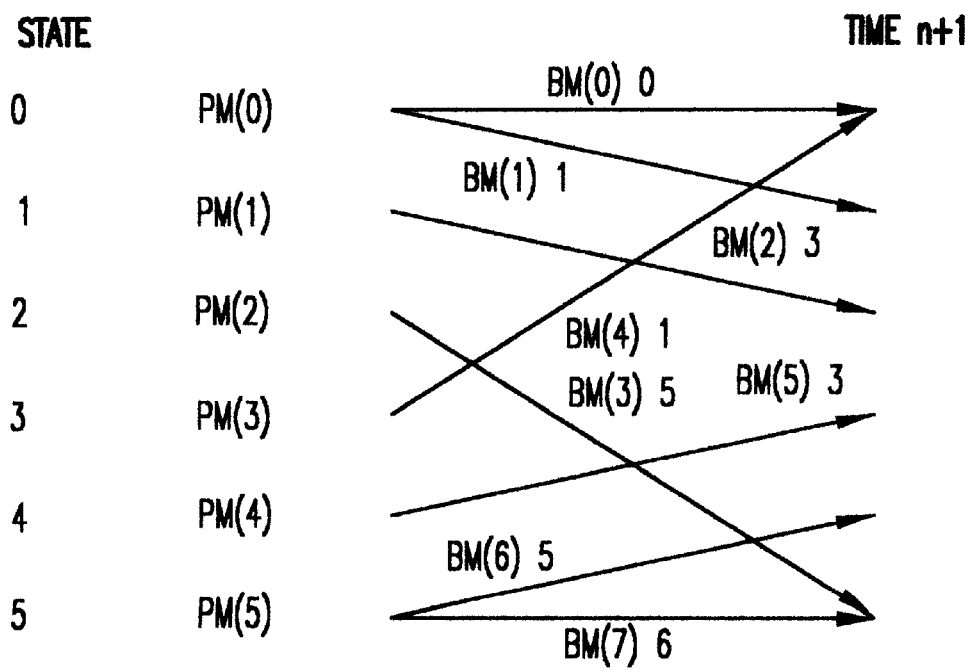
FIG. 28 is an illustration showing a state change (corresponding to claim 51) to each block under 1-clock path data, a minimum inversion interval of 3 and PR(1,2,2,1) pre-equalization, where the lateral axis indicates time.

The path selection and pathmetric unification are given by expanding the procedures in FIGS. 8 and 9 according to conditions in FIG. 28. The whole composition of the data-reproducing device in the fourteenth embodiment is similar to that shown in FIG. 10. The subtraction absolute value/comparison and selection circuits are given by expanding the compositions in FIG. 11 according to the conditions in FIG. 28. The path memory circuit is given by expanding the composition in FIG. 12 to have P(0,0) to P(0,5) and S(0,0) to S(0,5) according to the conditions in FIG. 28.

FB0s for getting survival state informations S(0,0) to S(0,5) are given by expanding the compositions in FIG. 13 according to the conditions in FIG. 28, and FB1s for getting 2-clock previous data are given by expanding the composition in FIG. 14 according to the conditions in FIG. 28. RAM addresses are given by expanding those in FIG. 15 according to conditions in FIG. 28. The RAM data correction circuit is similar to that in the first embodiment.

Figure 29:
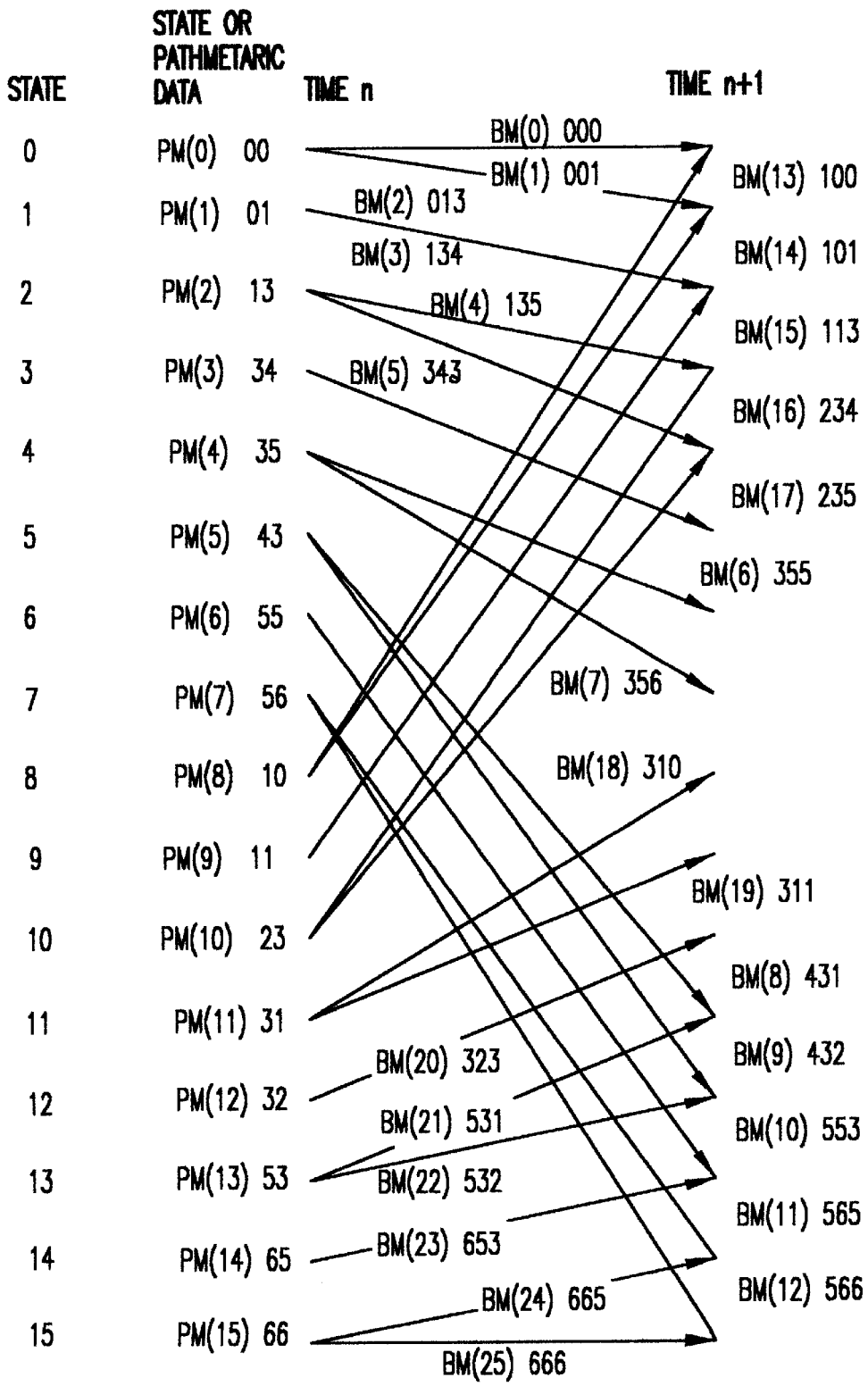
FIG. 29 is an illustration showing a state change (corresponding to claim 63) to each block under 3-clock path data, a minimum inversion interval of 2 and PR(1,2,2,1) pre-equalization, where the lateral axis indicates time.

A data-reproducing device in the fifteenth preferred embodiment (corresponding to claim 63 defined later) of the invention will be explained. As to the thirteenth embodiment, FIG. 4 shows a state change to each clock and FIG. 29 shows a state change that the lateral axis indicates time.

In the fifteenth embodiment, the minimum inversion interval is 2 and the path data or branchmetrics are expanded to 3-clock, in contrast to the ninth embodiment. PR(1,2,2,1) pre-equalization and reproduction data with 7-element (0,1, 2,3,4,5,6) are used. Path data or branchmetrics are of 3-clock data:

000, 001, 013, 100, 101, 113, 134, 135, 234, 235, 310, 311, 323, 343, 355, 356, 431, 432, 531, 532, 553, 565, 566, 653, 665, 666.

States or pathmetrics are of 2-clock data:

00, 01, 10, 11, 13, 23, 31, 32, 34, 35, 43, 53, 55, 56, 65, 66.

The path selection and pathmetric unification are given by expanding the procedures in FIGS. 8 and 9 according to conditions in FIG. 29. The whole composition of the data-reproducing device in the fifteenth embodiment is similar to that shown in FIG. 10. The subtraction absolute value/comparison and selection circuits are given by expanding the compositions in FIG. 11 according to the conditions in FIG. 29. The path memory circuit is given by expanding the composition in FIG. 12 to have P(0,0) to P(0,15) and S(0,0) to S(0,15) according to the conditions in FIG. 29.

FB0s for getting survival state informations S(0,0) to S(0,15) are given by expanding the compositions in FIG. 13 according to the conditions in FIG. 29, and FB1s for getting 2-clock previous data are given by expanding the composition in FIG. 14 according to the conditions in FIG. 29. RAM addresses are given by expanding those in FIG. 15 according to the conditions in FIG. 29. The RAM data correction circuit is similar to that in the first embodiment.

Figure 30:
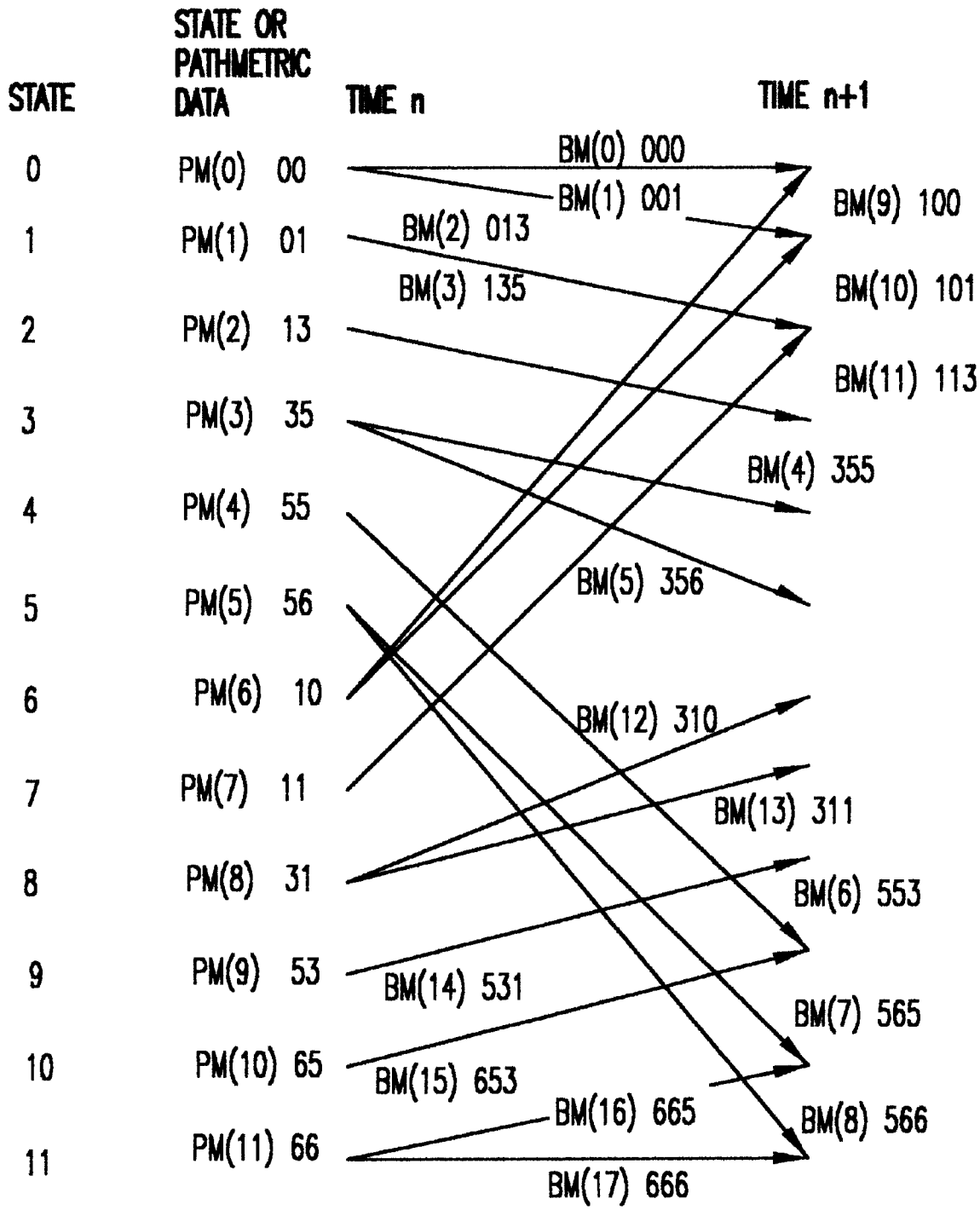
FIG. 30 is an illustration showing a state change (corresponding to claim 66) to each block under 3-clock path data, a minimum inversion interval of 3 and PR(1,2,2,1) pre-equalization, where the lateral axis indicates time.

A data-reproducing device in the sixteenth preferred embodiment (corresponding to claim 66 defined later) of the invention will be explained. As to the thirteenth embodiment, FIG. 6 shows a state change to each clock and FIG. 30 shows a state change that the lateral axis indicates time.

In the sixteenth embodiment, the minimum inversion interval is 3 and the path data or branchmetrics are expanded to 3-clock, in contrast to the ninth embodiment. PR(1,2,2,1) pre-equalization and reproduction data with 5-element (0,1, 3,5,6) are used. Path data or branchmetrics are of 3-clock data:

000, 001, 013, 100, 101, 113, 135, 310, 311, 355, 356, 531, 553, 565, 566, 653, 665, 666.

States or pathmetrics are of 2-clock data:

00, 01, 10, 11, 13, 31, 35, 53, 55, 56, 65, 66.

The path selection and pathmetric unification are given by expanding the procedures in FIGS. 8 and 9 according to conditions in FIG. 30. The whole composition of the data-reproducing device in the sixteenth embodiment is similar to that shown in FIG. 10. The subtraction absolute value/comparison and selection circuits are given by expanding the compositions in FIG. 11 according to the conditions in FIG. 30. The path memory circuit is given by expanding the composition in FIG. 12 to have P(0,0) to P(0,11) and S(0,0) to S(0,11) according to the conditions in FIG. 30.

FB0s for getting survival state informations S(0,0) to S(0,11) are given by expanding the compositions in FIG. 13 according to the conditions in FIG. 29, and FB1s for getting 2-clock previous data are given by expanding the composition in FIG. 14 according to the conditions in FIG. 30. RAM addresses are given by expanding those in FIG. 15 according to the conditions in FIG. 30. The RAM data correction circuit is similar to that in the first embodiment.

On the other hand, in the above embodiment, path data or branchmetrics may be of 3-clock or more without the condition of minimum inversion interval, or path data or branchmetrics may be of 4-clock or more with a minimum inversion interval of 2 or 3 (corresponding to claim 69 defined later). According to these, state changes can be illustrated in like manner. The output data can be calculated by reducing or expanding FIGS. 8 to 15.

Though previous data used in the above embodiments are of 2-clock, they may be of 0-clock or 1-clock, which means that previous data are not used, or may be 4 clocks or more.

For example, when the clock number of previous data is 1, 2 or 3 in case of FIG. 7, they are selected from:

(in case of 1-clock)
 M(−1,0) to M(−1,2) = 0 or 1
 M(−1,3) to M(−1,4) = 1
 M(−1,5) to M(−1,6) = 3
 M(−1,7) to M(−1,9) = 3 or 4
(in case of 2-clock)
 M(−2,0), M(−1,0) to M(−2,2), (−1,2) = 00, 10 or 31
 M(−2,3), M(−1,3) to M(−2,4), (−1,4) = 01 or 11
 M(−2,5), M(−1,5) to M(−2,6), (−1,6) = 33 or 43
 M(−2,7), M(−1,7) to M(−2,9), (−1,9) = 13, 34 or 44
(in case of 3-clock)
 M(−3,0), M(−2,0), M(−1,0) to M(−3,2), M(−2,2), (−1,2) = 000, 100, 310, 331 or 431
 M(−3,3), M(−2,3), M(−1,3) to M(−3,4), M(−2,4), (−1,4) = 001, 101 or 311
 M(−3,5), M(−2,5), M(−1,5) to M(−3,6), M(−2,6), (−1,6) = 133, 343 or 443
 M(−3,7), M(−2,7), M(−1,7), to M(−3,9), M(−2,9), (−1,9) = 013, 113, 134, 344 or 444

Namely, tracking the past paths, when the paths reach state 0, 1 "0" is obtained, when they reach state 2, 5, 6, "1" is obtained, when they reach state 3, 4, 7, "3" is obtained, and, when they reach state 8, 9, "4" is obtained.

Also, the above alterations are similarly applicable to the case in FIGS. 16 to 30.

Further, in the above embodiments, pre-equalization other than correct PR(1,2,1) and PR(1,2,2,1) equalizations may be also used. For example, even when there occurs an error gap in pre-equalization, e.g., even in case of substantially PR(0.8, 2.1, 1.2), PR(1.3, 1.9, 2.2, 0.9), the invention can be applied as it can correct the equalization error.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A data-reproducing device, comprising:
 a subtraction absolute value circuit for calculating a subtraction absolute value from pre-equalized reproduce data and estimate data output from a RAM circuit, and for outputting said subtraction absolute value as branchmetrics;
 a comparison and selection circuit for comparing addition values of said branchmetrics and previously calculated pathmetrics, selecting a smaller one of said values as a result of comparison, and outputting said smaller one of said values as new pathmetric as well as a section signal as to which of said values is selected;
 a path memory circuit for storing said selection signal, obtaining the most probable path by unifying paths, and outputting the most probable data according to said most probable path;
 a RAM circuit for outputting estimate data judged to be closest to said pre-equalized reproduce data by using a present output of said path memory circuit as an address; and
 a data correction circuit for renewing an internal data of said RAM circuit based upon a data obtained by using, as an address, said pre-equalized reproduce data delayed by a predetermined value and continuous data output from said path memory circuit.

2. A data-reproducing device, according to claim 1, wherein:
 to all states, as to two paths linking from previous clock, new temporary pathmetrics are calculated by adding branchmetric from previous clock to present clock to pathmetric at said previous clock, selecting smaller one of said new temporary pathmetrics as new pathmetric, using data as to which of said new temporary pathmetrics is selected as survival path information, enabling the survival state at said previous clock to be judged from said survival path information, enabling L-bit previous clock data, where $L \geq 0$ is to be satisfied, and path unification to be judged by tracking the judging result of said survival state to the past;
 a binary final output is obtained corresponding to said survival state where path unification is achieved; and
 a binary final output is obtained by deciding a majority between the number of surviving states to a binary final output of "0" and the number of surviving states to a binary final output of "1", when path unification is not achieved.

3. A data-reproducing device, according to claim 2, wherein:
 a recording code with a minimum inversion interval of 2 is used;
 reproduce data are pre-equalized into quaternary (0, 1, 3, 4) data by PR(1, 2, 1); and
 to all states, paths except impossible patterns of "03", "04", "14", "30", "40" and "41" are calculated.

4. A data-reproducing device, according to claim 2, wherein:
 a recording code with a minimum inversion interval of 3 is used;
 reproduce data are pre-equalized into quaternary (0, 1, 3, 4) data by PR(1, 2, 1); and
 to all states, paths except impossible patterns of "03", "04", "11", "14", "30", "33", "40" and "41" are calculated.

5. A data-reproducing device, according to claim 2, wherein:
 reproduce data are pre-equalized into 5-element (0, 1, 2, 3, 4) data by PR(1, 2, 1); and
 branchmetrics are of 2-clock data, 00, 01, 10, 11, 12, 13, 21, 22, 23, 31, 32, 33, 34, 43, 44.

6. A data-reproducing device, according to claim 2, wherein:
 a recording code with a minimum inversion interval of 2 is used;
 reproduce data are pre-equalized into 4-element (0, 1, 3, 4) data by PR(1, 2, 1); and
 branchmetrics are of 2-clock data, 00, 01, 10, 11, 13, 31, 33, 34, 43, 44.

7. A data-reproducing device, according to claim 2, wherein:
 a recording code with a minimum inversion interval of 3 is used;
 reproduce data are pre-equalized into 4-element (0, 1, 3, 4) data by PR(1, 2, 1); and
 branchmetrics are of 2-clock data, 00, 01, 10, 13, 31, 34, 43, 44.

8. A data-reproducing device, according to claim 2, wherein:
 reproduce data are pre-equalized into 5-element (0, 1, 2, 3, 4) data by PR(1, 2, 1); and
 branchmetrics are of 3-clock data, 000, 001, 012, 013, 100, 101, 112, 113, 121, 122, 133, 134, 210, 211, 221, 222, 223, 233, 234, 310, 311, 322, 323, 331, 332, 343, 344, 431, 432, 443, 444.

9. A data-reproducing device, according to claim 2, wherein:

a recording code with a minimum inversion interval of 2 is used;

reproduce data are pre-equalized into 4-element (0, 1, 3, 4) data by PR(1, 2, 1); and branchmetrics are of 3-clock data, 000, 001, 013, 100, 101, 113, 133, 134, 310, 311, 331, 343, 344, 431, 443, 444.

10. A data-reproducing device, according to claim 2, wherein:

a recording code with a minimum inversion interval of 3 is used;

reproduce data are pre-equalized into 4-element (0, 1, 3, 4) data by PR(1, 2, 1); and branchmetrics are of 3-clock data, 000, 001, 013, 100, 101, 134, 310, 343, 344, 431, 443, 444.

11. A data-reproducing device, according to claim 2, wherein:

a recording code with a minimum inversion interval of 2 is used;

reproduce data are pre-equalized into 4-element (0, 1, 3, 4) data by PR(1, 2, 1); and branchmetrics are of 4-clock data, 0000, 0001, 0013, 0133, 0134, 1000, 1001, 1013, 1133, 1134, 1331, 1343, 1344, 3100, 3101, 3113, 3310, 3311, 3431, 3443, 3444, 4310, 4311, 4431, 4443, 4444.

12. A data-reproducing device, according to claim 2, wherein:

a recording code with a minimum inversion interval of 3 is used;

reproduce data are pre-equalized into 4-element (0, 1, 3, 4) data by PR(1, 2, 1); and branchmetrics are of 4-clock data, 0000, 0001, 0013, 0134, 1000, 1001, 1013, 1343, 1344, 3100, 3101, 3431, 3443, 3444, 4310, 4431, 4443, 4444.

13. A data-reproducing device, according to claim 2, wherein:

reproduce data are pre-equalized into 5-element data by PR(1, 2, 1); or a recording code with a minimum inversion interval of 2 or 3 is used, reproduce data are pre-equalized into 4-element data and branchmetrics are of 1-clock data.

14. A data-reproducing device, according to claim 2, wherein:

reproduce data are pre-equalized into 5-element data by PR(1, 2, 1) and branchmetrics are of 4-clock or more data; or a recording code with a minimum inversion interval of 2 or 3 is used, reproduce data are pre-equalized into 4-element data and branchmetrics are of 5-clock or more data.

15. A data-reproducing device, according to claim 2, wherein:

reproduce data are pre-equalized into 7-element (0, 1, 2, 3, 4, 5, 6) data by PR(1, 2, 2, 1); and to all states, paths except impossible patterns of "02", "03", "04", "05", "06", "14", "15", "16", "20", "24", "25", "26", "30", "36", "40", "41", "42", "46", "50", "51", "52", "60", "61", "62", "63", "64" are calculated.

16. A data-reproducing device, according to claim 2, wherein:

a recording code with a minimum inversion interval of 2 is used;

reproduce data are pre-equalized into 7-element (0, 1, 2, 3, 4, 5, 6) data by PR(1, 2, 2, 1); and to all states, paths except impossible patterns of "02", "03", "04", "05", "06", "12", "14", "15", "16", "20", "21", "22", "24", "25", "26", "30", "33", "36", "40", "41", "42", "44", "45", "46", "50", "51", "52", "54", "60", "61", "62", "63", "64" are calculated.

17. A data-reproducing device, according to claim 2 wherein:

a recording code with a minimum inversion interval of 3 is used;

reproduce data are pre-equalized into 7-element (0, 1, 2, 3, 4, 5, 6) data by PR(1, 2, 2, 1); and to all states, paths except impossible patterns of "02", "03", "04", "05", "06", "12", "14", "15", "16", "20", "21", "22", "23", "24", "25", "26", "30", "32", "33", "34", "36", "40", "41", "42", "43", "44", "45", "46", "50", "51", "52", "54", "60", "61", "62", "63", "64" are calculated.

18. A data-reproducing device, according to claim 2 wherein:

reproduce data are pre-equalized into 7-element (1, 2, 3, 4, 5, 6) data by PR(1, 2, 2, 1); and branchmetrics are of 1-clock data, 0, 1, 2, 3, 4, 5, 6.

19. A data-reproducing device, according to claim 2 wherein:

a recording code with a minimum inversion interval of 2 is used;

reproduce data are pre-equalized into 7-element (0, 1, 2, 3, 4, 5, 6) data by PR(1, 2, 2, 1); and branchmetrics are of 1-clock data, 0, 1, 2, 3, 4, 5, 6.

20. A data-reproducing device, according to claim 2 wherein:

a recording code with a minimum inversion interval of 3 is used;

reproduce data are pre-equalized into 5-element (0, 1, 3, 5, 6) data by PR(1, 2, 2, 1); and branchmetrics are of 1-clock data, 0, 1, 3, 5, 6.

21. A data-reproducing device, according to claim 2 wherein:

reproduce data are pre-equalized into 7-element (0, 1, 2, 3, 4, 5, 6) data by PR(1, 2, 2, 1); and branchmetrics are of 2-clock data, 00, 01, 10, 11, 12, 13, 21, 22, 23, 31, 32, 33, 34, 35, 43, 44, 45, 53, 54, 55, 56, 65, 66.

22. A data-reproducing device, according to claim 2 wherein:

a recording code with a minimum inversion interval of 2 is used;

reproduce data are pre-equalized into 7-element (0, 1, 2, 3, 4, 5, 6) data by PR(1, 2, 2, 1); and branchmetrics are of 2-clock data, 00, 01, 10, 11, 12, 13, 21, 22, 23, 31, 32, 33, 34, 35, 43, 44, 45, 53, 54, 55, 56, 65, 66.

23. A data-reproducing device, according to claim 2 wherein:

a recording code with a minimum inversion interval of 3 is used;

reproduce data are pre-equalized into 5-element (0, 1, 3, 5, 6) data by PR(1, 2, 2, 1); and branchmetrics are of 2-clock data, 00, 01, 10, 11, 13, 31, 35, 53, 55, 56, 65, 66.

24. A data-reproducing device, according to claim 2 wherein:

a recording code with a minimum inversion interval of 2 is used;

reproduce data are pre-equalized into 7-element (0, 1, 2, 3, 4, 5, 6) data by PR(1, 2, 2, 1); and branchmetrics are of 3-clock data, 000, 001, 013, 100, 101, 113, 134, 135, 234, 235, 310, 311, 323, 343, 355, 356, 431, 432, 531, 532, 553, 565, 566, 653, 665, 666.

25. A data-reproducing device, according to claim 2 wherein:

a recording code with a minimum inversion interval of 3 is used;

reproduce data are pre-equalized into 5-element (0, 1, 3, 5, 6) data by PR(1, 2, 2, 1); and branchmetrics are of 3-clock data, 000, 001, 013, 100, 101, 113, 135, 310, 311, 355, 356, 531, 553, 565, 566, 653, 665, 666.

26. A data-reproducing device, according to claim 2, wherein:

reproduce data are pre-equalized into 7-element data by PR(1, 2, 2, 1) and branchmetrics are of 3-clock or more data;

a recording code with a minimum inversion interval of 2 is used, reproduce data are pre-equalized into 7-element data and branchmetrics are of 4-clock or more data; or a recording code with a minimum inversion interval of 3 is used, reproduce data are pre-equalized into 5-element data and branchmetrics are of 4-clock or more data.

27. A data-reproducing device, according to claim 2, wherein:

input data and old RAM data are added with weights $\mu$, $1-\mu$, respectively, where $0 \leq \mu \leq 1$ is to be satisfied, and RAM data are optimized by renewing the addition result said as new RAM data.

28. A data-reproducing device, according to claim 2, wherein:

a difference value obtained by subtracting old RAM data from input data is accumulated, and said RAM data are increased by one step when the accumulation result exceeds a positive(+) threshold value, and said RAM data are decreased by one step when the accumulation result is less than a negative(−) threshold value, so as to optimize RAM data.

29. A data-reproducing device, according to claim 1, wherein:

a recording code with a minimum inversion interval of 2 is used;

reproduce data are pre-equalized into quaternary (0, 1, 3, 4) data by PR (1, 2, 1); and to all states, paths except impossible patterns of "03", "04", "14", "30", "40" and "41" are calculated.

30. A data-reproducing device, according to claim 29, wherein:

a recording code with a minimum inversion interval of 2 is used;

reproduce data are pre-equalized into 4-element (0, 1, 3, 4) data by PR(1, 2, 1); and branchmetrics are of 2-clock data, 00, 01, 10, 11, 13, 31, 33, 34, 43, 44.

31. A data-reproducing device, according to claim 29, wherein:

a recording code with a minimum inversion interval of 2 is used;

reproduce data are pre-equalized into 4-element (0, 1, 3, 4) data by PR(1, 2, 1); and branchmetrics are of 3-clock data, 000, 001, 013, 100, 101, 113, 133, 134, 310, 311, 331, 343, 344, 431, 443, 444.

32. A data-reproducing device, according to claim 29, wherein:

a recording code with a minimum inversion interval of 2 is used;

reproduce data are pre-equalized into 4-element (0, 1, 3, 4) data by PR(1, 2, 1); and branchmetrics are of 4-clock data, 0000, 0001, 0013, 0133, 0134, 1000, 1001, 1013, 1133, 1134, 1331, 1343, 1344, 3100, 3101, 3113, 3310, 3311, 3431, 3443, 3444, 4310, 4311, 4431, 4443, 4444.

33. A data-reproducing device, according to claim 29, wherein:

reproduce data are pre-equalized into 5-element data by PR(1, 2, 1); or a recording code with a minimum inversion interval of 2 or 3 is used, reproduce data are pre-equalized into 4-element data and branchmetrics are of 1-clock data.

34. A data-reproducing device, according to claim 29, wherein:

reproduce data are pre-equalized into 5-element data by PR(1, 2, 1) and branchmetrics are of 4-clock or more data; or a recording code with a minimum inversion interval of 2 or 3 is used, reproduce data are pre-equalized into 4-element data and branchmetrics are of 5-clock or more data.

35. A data-reproducing device, according to claim 29, wherein:

reproduce data are pre-equalized into 7-element data by PR(1, 2, 2, 1) and branchmetrics are of 3-clock or more data;

a recording code with a minimum inversion interval of 2 is used, reproduce data are pre-equalized into 7-element data and branchmetrics are of 4-clock or more data; or a recording code with a minimum inversion interval of 3 is used, reproduce data are pre-equalized into 5-element data and branchmetrics are of 4-clock or more data.

36. A data-reproducing device, according to claim 29, wherein:

input data and old RAM data are added with weights $\mu$, $1-\mu$, respectively, where $0 \leq \mu \leq 1$ is to be satisfied, and RAM data are optimized by renewing the addition result said as new RAM data.

37. A data-reproducing device, according to claim 29, wherein:

a difference value obtained by subtracting old RAM data from input data is accumulated, and said RAM data are increased by one step when the accumulation result exceeds a positive(+) threshold value, and said RAM data are decreased by one step when the accumulation result is less than a negative(−) threshold value, so as to optimize RAM data.

38. A data-reproducing device, according to claim 1, wherein:

a recording code with a minimum inversion interval of 3 is used;

reproduce data are pre-equalized into quaternary (0, 1, 3, 4) data by PR(1, 2, 1); and to all states, paths except impossible patterns of "03", "04", "11", "14", "30", "33", "40" and "41" are calculated.

39. A data-reproducing device, according to claim 38, wherein:

a recording code with a minimum inversion interval of 3 is used;

reproduce data are pre-equalized into 4-element (0, 1, 3, 4) data by PR(1, 2, 1); and branchmetrics are of 2-clock data, 00, 01, 10, 13, 31, 34, 43, 44.

40. A data-reproducing device, according to claim 38, wherein:

a recording code with a minimum inversion interval of 3 is used;

reproduce data are pre-equalized into 4-element (0, 1, 3, 4) data by PR(1, 2, 1); and branchmetrics are of 3-clock data, 000, 001, 013, 100, 101, 134, 310, 343, 344, 431, 443, 444.

41. A data-reproducing device, according to claim 38, wherein:

a recording code with a minimum inversion interval of 3 is used;

reproduce data are pre-equalized into 4-element (0, 1, 3, 4) data by PR(1, 2, 1); and branchmetrics are of 4-clock data, 0000, 0001, 0013, 0134, 1000, 1001, 1013, 1343, 1344, 3100, 3101, 3431, 3443, 3444, 4310, 4431, 4443, 4444.

42. A data-reproducing device, according to claim 38, wherein:

reproduce data are pre-equalized into 5-element data by PR(1, 2, 1); or a recording code with a minimum inversion interval of 2 or 3 is used, reproduce data are pre-equalized into 4-element data and branchmetrics are of 1-clock data.

43. A data-reproducing device, according to claim 38, wherein:

reproduce data are pre-equalized into 5-element data by PR(1, 2, 1) and branchmetrics are of 4-clock or more data; or a recording code with a minimum inversion interval of 2 or 3 is used, reproduce data are pre-equalized into 4-element data and branchmetrics are of 5-clock or more data.

44. A data-reproducing device, according to claim 38, wherein:

reproduce data are pre-equalized into 7-element data by PR(1, 2, 2, 1) and branchmetrics are of 3-clock or more data;

a recording code with a minimum inversion interval of 2 is used, reproduce data are pre-equalized into 7-element data and branchmetrics are of 4-clock or more data; or a recording code with a minimum inversion interval of 3 is used, reproduce data are pre-equalized into 5-element data and branchmetrics are of 4-clock or more data.

45. A data-reproducing device, according to claim 38, wherein:

input data and old RAM data are added with weights $\mu$, $1-\mu$, respectively, where $0 \leq \mu \leq 1$ is to be satisfied, and RAM data are optimized by renewing the addition result said as new RAM data.

46. A data-reproducing device, according to claim 38, wherein:

a difference value obtained by subtracting old RAM data from input data is accumulated, and said RAM data are increased by one step when the accumulation result exceeds a positive(+) threshold value, and said RAM data are decreased by one step when the accumulation result is less than a negative(−) threshold value, so as to optimize RAM data.

47. A data-reproducing device, according to claim 1, wherein:

reproduce data are pre-equalized into 5-element (0, 1, 2, 3, 4) data by PR(1, 2, 1); and branchmetrics are of 2-clock data, 00, 01, 10, 11, 12, 13, 21, 22, 23, 31, 32, 33, 34, 43, 44.

48. A data-reproducing device, according to claim 1, wherein:

a recording code with a minimum inversion interval of 2 is used;

reproduce data are pre-equalized into 4-element (0, 1, 3, 4) data by PR(1, 2, 1); and branchmetrics are of 2-clock data, 00, 01, 10, 11, 13, 31, 33, 34, 43, 44.

49. A data-reproducing device, according to claim 1, wherein:

a recording code with a minimum inversion interval of 3 is used;

reproduce data are pre-equalized into 4-element (0, 1, 3, 4) data by PR(1, 2, 1); and branchmetrics are of 2-clock data, 00, 01, 10, 13, 31, 34, 43, 44.

50. A data-reproducing device, according to claim 1, wherein:

reproduce data are pre-equalized into 5-element (0, 1, 2, 3, 4) data by PR(1, 2, 1); and branchmetrics are of 3-clock data, 000, 001, 012, 013, 100, 101, 112, 113, 121, 122, 133, 134, 210, 211, 221, 222, 223, 233, 234, 310, 311, 322, 323, 331, 332, 343, 344, 431, 432, 443, 444.

51. A data-reproducing device, according to claim 1, wherein:

a recording code with a minimum inversion interval of 2 is used;

reproduce data are pre-equalized into 4-element (0, 1, 3, 4) data by PR(1, 2, 1); and branchmetrics are of 3-clock data, 000, 001, 013, 100, 101, 113, 133, 134, 310, 311, 331, 343, 344, 431, 443, 444.

52. A data-reproducing device, according to claim 1, wherein:

a recording code with a minimum inversion interval of 3 is used;

reproduce data are pre-equalized into 4-element (0, 1, 3, 4) data by PR(1, 2, 1); and branchmetrics are of 3-clock data, 000, 001, 013, 100, 101, 134, 310, 343, 344, 431, 443, 444.

53. A data-reproducing device, according to claim 1, wherein:

a recording code with a minimum inversion interval of 2 is used;

reproduce data are pre-equalized into 4-element (0, 1, 3, 4) data by PR(1, 2, 1); and branchmetrics are of 4-clock data, 0000, 0001, 0013, 0133, 0134, 1000, 1001, 1013, 1133, 1134, 1331, 1343, 1344, 3100, 3101, 3113, 3310, 3311, 3431, 3443, 3444, 4310, 4311, 4431, 4443, 4444.

54. A data-reproducing device, according to claim 1, wherein:
a recording code with a minimum inversion interval of 3 is used;
reproduce data are pre-equalized into 4-element (0, 1, 3, 4) data by PR(1, 2, 1); and
branchmetrics are of 4-clock data, 0000, 0001, 0013, 0134, 1000, 1001, 1013, 1343, 1344, 3100, 3101, 3431, 3443, 3444, 4310, 4431, 4443, 4444.

55. A data-reproducing device, according to claim 1, wherein:
reproduce data are pre-equalized into 5-element data by PR(1, 2, 1); or
a recording code with a minimum inversion interval of 2 or 3 is used, reproduce data are pre-equalized into 4-element data and branchmetrics are of 1-clock data.

56. A data-reproducing device, according to claim 1, wherein:
reproduce data are pre-equalized into 5-element data by PR(1, 2, 1) and branchmetrics are of 4-clock or more data; or
a recording code with a minimum inversion interval of 2 or 3 is used, reproduce data are pre-equalized into 4-element data and branchmetrics are of 5-clock or more data.

57. A data-reproducing device, according to claim 1, wherein:
reproduce data are pre-equalized into 7-element (0, 1, 2, 3, 4, 5, 6) data by PR(1, 2, 2, 1); and
to all states, paths except impossible patterns of "02", "03", "04", "05", "06", "14", "15", "16", "20", "24", "25", "26", "30", "36", "40", "41", "42", "46", "50", "51", "52", "60", "61", "62", "63", "64" are calculated.

58. A data-reproducing device, according to claim 57, wherein:
a recording code with a minimum inversion interval of 2 is used;
reproduce data are pre-equalized into 7-element (0, 1, 2, 3, 4, 5, 6) data by PR(1, 2, 2, 1); and
to all states, paths except impossible patterns of "02", "03", "04", "05", "06", "12", "14", "15", "16", "20", "21", "22", "24", "25", "26", "30", "33", "36", "40", "41", "42", "44", "45", "46", "50", "51", "52", "54", "60", "61", "62", "63", "64" are calculated.

59. A data-reproducing device, according to claim 57 wherein:
a recording code with a minimum inversion interval of 3 is used;
reproduce data are pre-equalized into 7-element (0, 1, 2, 3, 4, 5, 6) data by PR(1, 2, 2, 1); and
to all states, paths except impossible patterns of "02", "03", "04", "05", "06", "12", "14", "15", "16", "20", "21", "22", "23", "24", "25", "26", "30", "32", "33", "34", "36", "40", "41", "42", "43", "44", "45", "46", "50", "51", "52", "54", "60", "61", "62", "63", "64" are calculated.

60. A data-reproducing device, according to claim 57 wherein:
reproduce data are pre-equalized into 7-element (0, 1, 2, 3, 4, 5, 6) data by PR(1, 2, 2, 1); and
branchmetrics are of 1-clock data, 0, 1, 2, 3, 4, 5, 6.

61. A data-reproducing device, according to claim 57 wherein:

reproduce data are pre-equalized into 7-element (0, 1, 2, 3, 4, 5, 6) data by PR(1, 2, 2, 1); and
branchmetrics are of 2-clock data, 00, 01, 10, 11, 12, 13, 21, 22, 23, 31, 32, 33, 34, 35, 43, 44, 45, 53, 54, 55, 56, 65, 66.

62. A data-reproducing device, according to claim 57, wherein:
reproduce data are pre-equalized into 7-element data by PR(1, 2, 2, 1) and branchmetrics are of 3-clock or more data;
a recording code with a minimum inversion interval of 2 is used, reproduce data are pre-equalized into 7-element data and branchmetrics are of 4-clock or more data; or
a recording code with a minimum inversion interval of 3 is used, reproduce data are pre-equalized into 5-element data and branchmetrics are of 4-clock or more data.

63. A data-reproducing device, according to claim 57, wherein:
input data and old RAM data are added with weights $\mu$, $1-\mu$, respectively, where $0 \leq \mu \leq 1$ is to be satisfied, and
RAM data are optimized by renewing the addition result said as new RAM data.

64. A data-reproducing device, according to claim 57, wherein:
a difference value obtained by subtracting old RAM data from input data is accumulated, and
said RAM data are increased by one step when the accumulation result exceeds a positive(+) threshold value, and said RAM data are decreased by one step when the accumulation result is less than a negative(−) threshold value, so as to optimize RAM data.

65. A data-reproducing device, according to claim 1, wherein:
a recording code with a minimum inversion interval of 2 is used;
reproduce data are pre-equalized into 7-element (0, 1, 2, 3, 4, 5, 6) data by PR(1, 2, 2, 1); and
to all states, paths except impossible patterns of "02", "03", "04", "05", "06", "12", "14", "15", "16", "20", "21", "22", "24", "25", "26", "30", "33", "36", "40", "41", "42", "44", "45", "46", "50", "51", "52", "54", "60", "61", "62", "63", "64" are calculated.

66. A data-reproducing device, according to claim 65 wherein:
a recording code with a minimum inversion interval of 2 is used;
reproduce data are pre-equalized into 7-element (0, 1, 2, 3, 4, 5, 6) data by PR(1, 2, 2, 1); and
branchmetrics are of 1-clock data, 0, 1, 2, 3, 4, 5, 6.

67. A data-reproducing device, according to claim 65 wherein:
a recording code with a minimum inversion interval of 2 is used;
reproduce data are pre-equalized into 7-element (0, 1, 2, 3, 4, 5, 6) data by PR(1, 2, 2, 1); and
branchmetrics are of 2-clock data, 00, 01, 10, 11, 13, 23, 31, 32, 34, 35, 43, 53, 55, 56, 65, 66.

68. A data-reproducing device, according to claim 65 wherein:
a recording code with a minimum inversion interval of 2 is used;
reproduce data are pre-equalized into 7-element (0, 1, 2, 3, 4, 5, 6) data by PR(1, 2, 2, 1); and branchmetrics are of 3-clock data, 000, 001, 013, 100, 101, 113, 134, 135, 234, 235, 310, 311, 323, 343, 355, 356, 431, 432, 531, 532, 553, 565, 566, 653, 665, 666.

69. A data-reproducing device, according to claim 1 wherein:

a recording code with a minimum inversion interval of 3 is used;

reproduce data are pre-equalized into 7-element (0, 1, 2, 3, 4, 5, 6) data by PR(1, 2, 2, 1); and to all states, paths except impossible patterns of "02", "03", "04", "05", "06", "12", "14", "15", "16", "20", "21", "22", "23", "24", "25", "26", "30", "32", "33", "34", "36", "40", "41", "42", "43", "44", "45", "46", "50", "51", "52", "54", "60", "61", "62", "63", "64" are calculated.

70. A data-reproducing device, according to claim 69 wherein:

a recording code with a minimum inversion interval of 3 is used;

reproduce data are pre-equalized into 5-element (0, 1, 3, 5, 6) data by PR(1, 2, 2, 1); and branchmetrics are of 1-clock data, 0, 1, 3, 5, 6.

71. A data-reproducing device, according to claim 69 wherein:

a recording code with a minimum inversion interval of 3 is used;

reproduce data are pre-equalized into 5-element (0, 1, 3, 5, 6) data by PR(1, 2, 2, 1); and branchmetrics are of 2-clock data, 00, 01, 10, 11, 13, 31, 35, 53, 55, 56, 65, 66.

72. A data-reproducing device, according to claim 69 wherein:

a recording code with a minimum inversion interval of 3 is used;

reproduce data are pre-equalized into 5-element (0, 1, 3, 5, 6) data by PR(1, 2, 2, 1); and branchmetrics are of 3-clock data, 000, 001, 013, 100, 101, 113, 135, 310, 311, 355, 356, 531, 553, 565, 566, 653, 665, 666.

73. A data-reproducing device, according to claim 1 wherein:

reproduce data are pre-equalized into 7-element (0, 1, 2, 3, 4, 5, 6) data by PR(1, 2, 2, 1); and branchmetrics are of 1-clock data, 0, 1, 2, 3, 4, 5, 6.

74. A data-reproducing device, according to claim 1 wherein:

a recording code with a minimum inversion interval of 2 is used;

reproduce data are pre-equalized into 7-element (0, 1, 2, 3, 4, 5, 6) data by PR(1, 2, 2, 1); and branchmetrics are of 1-clock data, 0, 1, 2, 3, 4, 5, 6.

75. A data-reproducing device, according to claim 1 wherein:

a recording code with a minimum inversion interval of 3 is used;

reproduce data are pre-equalized into 5-element (0, 1, 3, 5, 6) data by PR(1, 2, 2, 1); and branchmetrics are of 1-clock data, 0, 1, 3, 5, 6.

76. A data-reproducing device, according to claim 1 wherein:

reproduce data are pre-equalized into 7-element (0, 1, 2, 3, 4, 5, 6) data by PR(1, 2, 2, 1); and branchmetrics are of 2-clock data, 00, 01, 10, 11, 12, 13, 21, 22, 23, 31, 32, 33, 34, 35, 43, 44, 45, 53, 54, 55, 56, 65, 66.

77. A data-reproducing device, according to claim 1 wherein:

a recording code with a minimum inversion interval of 2 is used;

reproduce data are pre-equalized into 7-element (0, 1, 2, 3, 4, 5, 6) data by PR(1, 2, 2, 1); and branchmetrics are of 2-clock data, 00, 01, 10, 11, 12, 13, 21, 22, 23, 31, 32, 33, 34, 35, 43, 44, 45, 53, 54, 55, 56, 65, 66.

78. A data-reproducing device, according to claim 1 wherein:

a recording code with a minimum inversion interval of 3 is used;

reproduce data are pre-equalized into 5-element (0, 1, 3, 5, 6) data by PR(1, 2, 2, 1); and branchmetrics are of 2-clock data, 00, 01, 10, 11, 13, 31, 35, 53, 55, 56, 65, 66.

79. A data-reproducing device, according to claim 1 wherein:

a recording code with a minimum inversion interval of 2 is used;

reproduce data are pre-equalized into 7-element (0, 1, 2, 3, 4, 5, 6) data by PR(1, 2, 2, 1); and branchmetrics are of 3-clock data, 000, 001, 013, 100, 101, 113, 134, 135, 234, 235, 310, 311, 323, 343, 355, 356, 431, 432, 531, 532, 553, 565, 566, 653, 665, 666.

80. A data-reproducing device, according to claim 1 wherein:

a recording code with a minimum inversion interval of 3 is used;

reproduce data are pre-equalized into 5-element (0, 1, 3, 5, 6) data by PR(1, 2, 2, 1); and branchmetrics are of 3-clock data, 000, 001, 013, 100, 101, 113, 135, 310, 311, 355, 356, 531, 553, 565, 566, 653, 665, 666.

81. A data-reproducing device, according to claim 1, wherein:

reproduce data are pre-equalized into 7-element data by PR(1, 2, 2, 1) and branchmetrics are of 3-clock or more data;

a recording code with a minimum inversion interval of 2 is used, reproduce data are pre-equalized into 7-element data and branchmetrics are of 4-clock or more data; or a recording code with a minimum inversion interval of 3 is used, reproduce data are pre-equalized into 5-element data and branchmetrics are of 4-clock or more data.

82. A data-reproducing device, according to claim 1, wherein:

input data and old RAM data are added with weights $\mu$, $1-\mu$, respectively, where $0 \leq \mu \leq 1$ is to be satisfied, and RAM data are optimized by renewing the addition result said as new RAM data.

83. A data-reproducing device, according to claim 1, wherein:

a difference value obtained by subtracting old RAM data from input data is accumulated, and said RAM data are increased by one step when the accumulation result exceeds a positive(+) threshold value, and said RAM data are decreased by one step when the accumulation result is less than a negative(−) threshold value, so as to optimize RAM data.

* * * * *